(12) United States Patent
Shen et al.

(10) Patent No.: US 7,360,146 B1
(45) Date of Patent: Apr. 15, 2008

(54) **INVERSE FUNCTION OF MIN*:MIN*- (INVERSE FUNCTION OF MAX*:MAX*-)**

(75) Inventors: Ba-Zhong Shen, Irvine, CA (US);
Kelly Brian Cameron, Irvine, CA (US); Thomas A. Hughes, Jr., Dana Point, CA (US); Hau Thien Tran, Irvine, CA (US)

(73) Assignee: Broadcom Corporation, Irvine, CA (US)

( * ) Notice: Subject to any disclaimer, the term of this patent is extended or adjusted under 35 U.S.C. 154(b) by 969 days.

(21) Appl. No.: 10/347,732

(22) Filed: Jan. 21, 2003

Related U.S. Application Data

(60) Provisional application No. 60/427,979, filed on Nov. 20, 2002, now abandoned, provisional application No. 60/403,847, filed on Aug. 15, 2002, now abandoned.

(51) Int. Cl.
*H03M 13/03* (2006.01)
(52) U.S. Cl. .................................................. 714/794
(58) Field of Classification Search ................ 714/786, 714/819, 780, 794
See application file for complete search history.

(56) References Cited

U.S. PATENT DOCUMENTS

| | | | |
|---|---|---|---|
| 5,406,570 A | 4/1995 | Berrou et al. | |
| 5,446,747 A | 8/1995 | Berrou | |
| 5,563,897 A | 10/1996 | Pyndiah et al. | |
| 6,065,147 A | 5/2000 | Pyndiah et al. | |
| 6,119,264 A | 9/2000 | Berrou et al. | |
| 6,122,763 A | 9/2000 | Pyndiah et al. | |
| 6,484,283 B2* | 11/2002 | Stephen et al. | 714/786 |
| 6,671,335 B1* | 12/2003 | Kim et al. | 375/340 |
| 6,718,504 B1* | 4/2004 | Coombs et al. | 714/755 |
| 6,725,409 B1* | 4/2004 | Wolf | 714/755 |
| 2002/0042901 A1* | 4/2002 | Miyauchi et al. | 714/799 |
| 2002/0095640 A1* | 7/2002 | Arad et al. | 714/792 |

FOREIGN PATENT DOCUMENTS

| | | |
|---|---|---|
| EP | 0 735 696 A2 | 10/1996 |
| EP | 0 735 696 A3 | 1/1999 |
| FR | 91 05278 A1 | 10/1992 |

* cited by examiner

*Primary Examiner*—Guy Lamarre
*Assistant Examiner*—Sam Rizk
(74) *Attorney, Agent, or Firm*—Garlick Harrison & Markison; Shayne X. Short

(57) ABSTRACT

Inverse function of min*:min*– (inverse function of max*: max*–). Two new parameters are employed to provide for much improved decoding processing for codes that involve the determination of a log corrected minimal and/or a log corrected maximal value from among a number of possible values. Examples of some of the codes that may benefit from the improved decoding processing provided by the inverse function of min*:min*– (and/or inverse function of max*: max*–) include turbo coding, parallel concatenated trellis coded modulated (PC-TCM) code, turbo trellis coded modulated (TTCM) code, and low density parity check (LDPC) code among other types of codes. The total number of processing steps employed within the decoding of a signal is significantly reduced be employing the inverse function of min*:min*– (and/or inverse function of max*:max*–) processing.

56 Claims, 19 Drawing Sheets min* functional block employing min*- and min*+ processing (7 input embodiment)

High Definition Television (HDTV) communication system 200 cellular communication system 300 cellular communication system 400 uni-directional comm. system employing inverse function of min*: min*- (inverse function of max*: max*-) decoding processing 700 bi-directional comm. system employing inverse function of min*: min*- (inverse function of max*: max*-) decoding processing 800 one to many comm. system employing inverse function of min*: min*- (inverse function of max*: max*-) decoding processing 900 fiber-optic communication system employing inverse function of min*: min*- (inverse function of max*: max*-) decoding processing Fig. 12 straightforward min* functional block intermediate result sharing min* functional block min* functional block employing min*- and min*+ processing min* functional block employing min*- and min*+ processing (7 input embodiment)

straightforward min* processing method intermediate result sharing min* processing method min*- and min*+ processing method

INVERSE FUNCTION OF MIN*:MIN*- (INVERSE FUNCTION OF MAX*:MAX*-)

CROSS REFERENCE TO RELATED PATENTS/PATENT APPLICATIONS

The present U.S. Utility Patent Application claims priority pursuant to 35 U.S.C. § 119(e) to the following U.S. Provisional Patent Applications which are hereby incorporated herein by reference in their entirety and made part of the present U.S. Utility Patent Application for all purposes:

1. U.S. Provisional Application Ser. No. 60/403,847, entitled "Inverse of min*:min*- (the inverse of max*: max*-)," filed Aug. 15, 2002, now abandoned.

2. U.S. Provisional Application Ser. No. 60/427,979, "Single stage implementation of min*, max*, min and/or max to perform state metric calculation in SISO decoder," filed Nov. 20, 2002, now abandoned.

The following U.S. Utility Patent Applications are hereby incorporated herein by reference in their entirety and made part of the present U.S. Utility Patent Application for all purposes:

1. U.S. patent application Ser. No. 10/355,702, entitled "Single stage implementation of min*, max*, min and/or max to perform state metric calculation in SISO decoder," filed Jan. 2, 2003, now U.S. Pat. No. 7,137,059 B2, issued on Nov. 14, 2006.

2. U.S. patent application Ser. No. 09/952,309, entitled "METHOD AND APPARATUS FOR PERFORMING CALCULATIONS FOR FORWARD (ALPHA) AND REVERSE (BETA) METRICS IN A MAP DECODER," filed Sep. 12, 2001, now U.S. Pat. No. 7,012,975 B2, issued on Mar. 14, 2006.

3. U.S. patent application Ser. No. 09/952,210, entitled "METHOD AND APPARATUS FOR MIN* CALCULATION IN A MAP DECODER," filed Sep. 12, 2001, now U.S. Pat. No. 7,023,934 B2, issued on Apr. 4, 2006.

BACKGROUND OF THE INVENTION

1. Technical Field of the Invention

The invention relates generally to communication systems; and, more particularly, it relates to decoders within communication system that employ the determination of a minimal and/or maximal value from among a number of possible values when decoding a received signal.

2. Description of Related Art

Data communication systems have been under continual development for many years. One such type of communication system that has been of significant interest lately is a communication system that employs turbo codes. A primary directive in this area of development has been to try continually to lower the error floor within a communication system. The ideal goal has been to try to reach Shannon's limit in a communication channel. Shannon's limit may be viewed as being the data rate that is used in a communication channel, having a particular signal to noise ratio (SNR), that will achieve error free transmission through the channel. In other words, the Shannon limit is the theoretical bound for channel capacity for a given modulation and code rate.

It is also noted that there are other codes, besides turbo codes, that oftentimes employ calculations that are similar to those employed within turbo decoders. One such example is the low density parity check (LDPC) code. In performing calculations when decoding a received signal, it is common for decoders that employ both of these types of codes to operate in the natural log (ln) domain. For example, within the context of turbo decoders that employ a maximum "a priori" possibility (MAP) approach, a common simplification to the computations of this approach is to operate in the logarithmic domain. This converts all multiplications to additions, divisions to subtractions, and eliminates exponentials entirely, without affecting BER performance.

One somewhat difficult calculation is the natural log (ln) domain includes calculating the sum of exponentials as shown below:

$$\ln(e^a+e^b+e^c+\ldots)$$

This calculation can be significantly reduced in complexity using the Jacobian formula shown below:

$$\max{}^*(a,b)=\ln(e^a+e^b)=\max(a,b)+\ln(1+e^{-|a-b|})$$

This calculation is oftentimes referred to as being a max* calculation or max* operation. It is noted that the Jacobian formula simplification of the equation shown above presents the max* operation of only two variables, a and b. This calculation may be repeated over and over when trying to calculate a longer sum of exponentials. For example, to calculate $\ln(e^a+e^b+e^c)$, the following two max* operations may be performed:

$$\max{}^*(a,b)=\ln(e^a+e^b)=\max(a,b)+\ln(1+e^{-|a-b|})=x$$

$$\max{}^*(a,b,c)=\max{}^*(x,c)=\ln(e^x+e^c)=\max(x,c)+\ln(1+e^{-|x-c|})$$

While there has a been a great deal of development within the context of these various codes in general (turbo code and LDPC code), the extensive processing and computations required to perform decoding therein can be extremely burdensome—this one example above of the calculating the sum of exponentials illustrates the potentially complex and burdensome calculations needed when performing decoding. Sometimes the processing requirements are so burdensome that they simply prohibit their implementation within systems having very tight design budgets.

There have been some non-optimal approaches to deal with the burdensome calculations required to do such burdensome calculations. For example, in performing this basic max* operation, some decoders simply exclude the logarithmic correction factor of $\ln(1+e^{-|a-b|})$ altogether and use only the max(a,b) result which may be implemented within a single instruction within a digital signal processor (DSP). However, this will inherently introduce some degradation in decoder performance. Most of the common approaches that seek to provide some computational improvements either cut corners in terms of computational accuracy, or they do not provide a sufficient reduction in computational complexity to justify their integration. The prohibiting factor concerning the implementation of many of these codes, including turbo codes and LDPC codes, is oftentimes the inherent computational complexity required therein.

There still exists a need in the art to provide for more efficient solutions when making calculations, such as max*, within decoders that operate within the logarithmic domain.

BRIEF SUMMARY OF THE INVENTION

Various aspects of the invention can be found in a decoder that may be implemented within a communication receiver. The decoder is operable to perform min* processing by employing min*- and min*+ processing. The decoder includes a min*+ functional block that performs min*+ processing on min* inputs thereby generating an intermediate variable. The decoder also includes a min*- functional block that performs min*− processing on each of the min* inputs and the intermediate variable thereby generating min* outputs.

In certain embodiments, the min*+ processing and the min*− processing is performed on two elements at a time. These two elements may be two of the min* inputs. Alternatively, these two elements may include one of the min* inputs and the intermediate variable itself. The min*+ functional block is operable to perform all of its processing using a number of processes that is less than the total number of min* inputs. In addition, the min*− functional block is operable to perform all of its processing using a number of processes that is equal to the total number of min* inputs. The min*+ process and the min*− process are inverse functions of one another. The decoder may also be arranged such that it is operable to perform straightforward min* processing and/or intermediate result sharing min* processing on the min* inputs. In this way, the decoder may be operable to perform other decoding processing that is less optimal than the min* processing that employs both min*− and min*+ processing.

The decoder may be implemented within any number of devices including a satellite receiver, a high definition television (HDTV) set top box receiver, a base station receiver, a mobile receiver, a receiver, a mobile unit, a transceiver, and/or an advanced modulation satellite receiver. In addition, the decoder may be implemented within a communication receiver, and that communication receiver may be contained within any number of communication systems including a satellite communication receiver, a high definition television (HDTV) communication system, a cellular communication system, a microwave communication system, a point-to-point communication system, a uni-directional communication system, a bi-directional communication system, and/or a one to many communication system.

It is also noted that a decoder employing max* functionality, instead of min* functionality, may be employed alternatively without departing from the scope and spirit of the invention.

Other aspects of the invention may be found in a min* processing method that employs min*− and min*+ processing. The method includes performing min*+ processing on min* inputs thereby generating an intermediate variable, and the method includes performing min*− processing on each of the min* inputs and the intermediate variable thereby generating min* outputs.

In certain embodiments, the min*+ processing of the method operates on two elements that include two of the min* inputs. The min*− processing of the method operates on two elements that include one of the min* inputs and the intermediate variable. The min*+ processing performs a number of min*+ processes that is less than the total number of min* inputs. In addition, the min*− processing performs a number of min*− processes that is equal to the total number of min* inputs. Within the method, the min*+ process and the min*− process are inverse functions of one another. The method is also operable to support backward functionality by performing one or both of straightforward min* processing and intermediate result sharing min* processing on the min* inputs.

The method may be performed within a decoder that is included within any number of devices including a satellite receiver, a high definition television (HDTV) set top box receiver, a base station receiver, a mobile receiver, a receiver, a mobile unit, a transceiver, and/or an advanced modulation satellite receiver. In addition, the method may be performed within a decoder implemented within a communication receiver, and that communication receiver may be contained within any number of communication systems including a satellite communication receiver, a high definition television (HDTV) communication system, a cellular communication system, a microwave communication system, a point-to-point communication system, a uni-directional communication system, a bi-directional communication system, and/or a one to many communication system.

It is also noted that a method that employs max* processing, instead of min* processing, may be employed alternatively without departing from the scope and spirit of the invention.

The functionality and methods provided by the min*− and max*− processing approaches may be viewed as providing calculations that introduce two new parameters are employed to provide for much improved decoding processing for codes that involve the determination of a minimal and/or maximal value from among a number of possible values. Examples of some of the codes that may benefit from the improved decoding processing provided by the inverse functions of min*:min*− (and/or inverse function of max*:max*−) include turbo coding, parallel concatenated trellis coded modulated (PC-TCM) code, turbo trellis coded modulated (TTCM) code, and low density parity check (LDPC) code among other types of codes. The total number of processing steps employed within the decoding of a signal is significantly reduced be employing the inverse function of min*:min*− (and/or inverse function of max*:max*−) processing.

DETAILED DESCRIPTION OF THE INVENTION

The decoding process of the invention may properly be described as being performed within a variety of communication systems including those that employ turbo coding, parallel concatenated trellis coded modulated (PC-TCM) code, turbo trellis coded modulated (TTCM) code, low density parity check (LDPC) code, and other codes that perform calculations that are used to identify a minimum (or maximum) value from among a number of possible values during decoding. The invention is operable to perform calculations within the context of max* and/or min* that are used to identify an appropriate selection of a parameter employed within the decoding. The min* or max* calculation may be used when calculating alpha, beta, and extrinsic values, for example in the context of performing turbo related decoding. Any other calculations that seek to identify a minimal or maximal value from among a number of potential values may benefit from the improved computational efficiency and speed of the decoding processing provided by the invention.

FIGS. 1-11 illustrate a number of communication system context embodiments where the decoding processing of the invention may be implemented.

Figure 1:
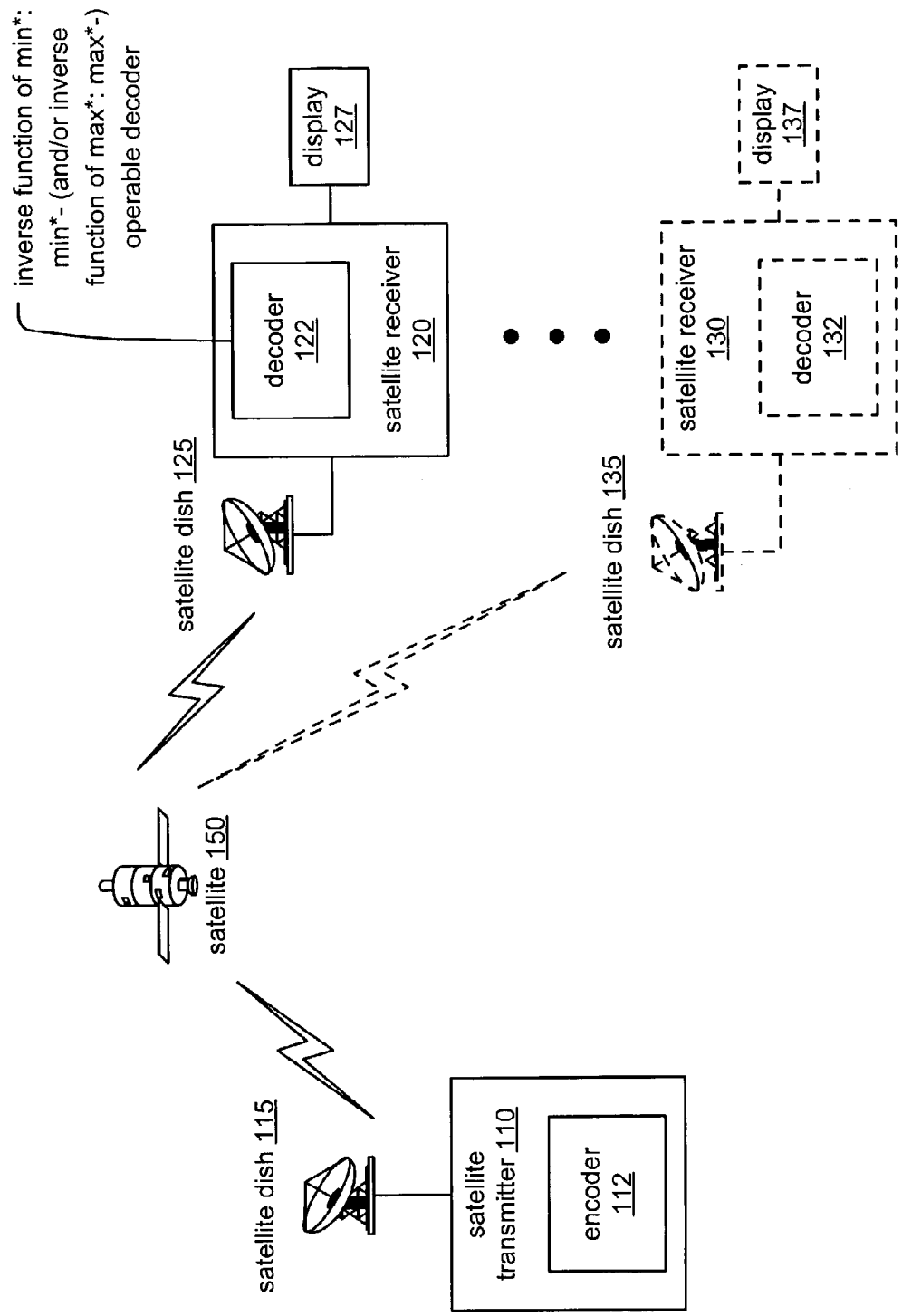
FIG. 1 is a system diagram illustrating an embodiment of a satellite communication system that is built according to the invention.

FIG. 1 is a system diagram illustrating an embodiment of a satellite communication system 100 that is built according to the invention. A satellite transmitter 110 includes an encoder 112. The encoder 112 is one of several possible embodiments that employ any of the codes whose decoding involves calculating a minimal or maximal value parameter to decode a received signal. The encoder 112 is operable to encode data that is to be transmitted by the satellite transmitter 110. The satellite transmitter 110 is communicatively coupled to a satellite dish 115 that is operable to communicate with a satellite 150. The satellite transmitter 110 may also be communicatively coupled to a wired network. This wired network may include any number of networks including the Internet, proprietary networks, and other wired networks. The satellite transmitter 110 employs the satellite dish 115 to communicate to the satellite 150 via a wireless communication channel. The satellite 150 is able to communicate with one or more satellite receivers, shown as a satellite receiver 120 (having a satellite dish 125), . . . , and a satellite receiver 130 (having a satellite dish 135). Each of the satellite receiver 120 and the satellite receiver 130 includes a decoder; specifically, the satellite receiver 120 includes a decoder 122, and the satellite receiver 130 includes a decoder 132. Each of the satellite receiver 120 and the satellite receiver 130 may also be communicatively coupled to a display. Again, specifically, the satellite receiver 120 may be communicatively coupled to a display 127, and the satellite receiver 130 may be communicatively coupled to a display 137. Various and further details will be provided below regarding the various embodiments in which the decoders 122 and 132 may be implemented to perform the decoding processing of the invention.

Here, the communication to and from the satellite 150 may cooperatively be viewed as being a wireless communication channel, or each of the communication to and from the satellite 150 may be viewed as being two distinct wireless communication channels.

For example, the wireless communication "channel" may be viewed as not including multiple wireless hops in one embodiment. In other embodiments, the satellite 150 receives a signal received from the satellite transmitter 110 (via its satellite dish 115), amplifies it, and relays it to satellite receiver 120 (via its satellite dish 125); the satellite receiver 120 may also be implemented using terrestrial receivers such as satellite receivers, satellite based telephones, and satellite based Internet receivers, among other receiver types. In the case where the satellite 150 receives a signal received from the satellite transmitter 110 (via its satellite dish 115), amplifies it, and relays it, the satellite 150 may be viewed as being a "transponder." In addition, other satellites may exist that perform both receiver and transmitter operations in cooperation with the satellite 150. In this case, each leg of an up-down transmission via the wireless communication channel would be considered separately.

In whichever embodiment, the satellite 150 communicates with the satellite receiver 120. The satellite receiver 120 may be viewed as being a mobile unit in certain embodiments (employing a local antenna); alternatively, the satellite receiver 120 may be viewed as being a satellite earth station that may be communicatively coupled to a wired network in a similar manner in which the satellite transmitter 110 may also be communicatively coupled to a wired network. In both situations, the satellite receiver 120 and the satellite receiver 130 are each operable to support the decoder 122 and the decoder 132 contained therein, respectively. The FIG. 1 shows one of the many embodiments where coding (encoding and decoding) may be performed according to any one or more of the various embodiments of the invention. The decoding of the decoders 122 and 132 is operable to support inverse function of min*:min*− (and/or inverse function of max*:max*−) decoding processing according to the invention.

Figure 2:
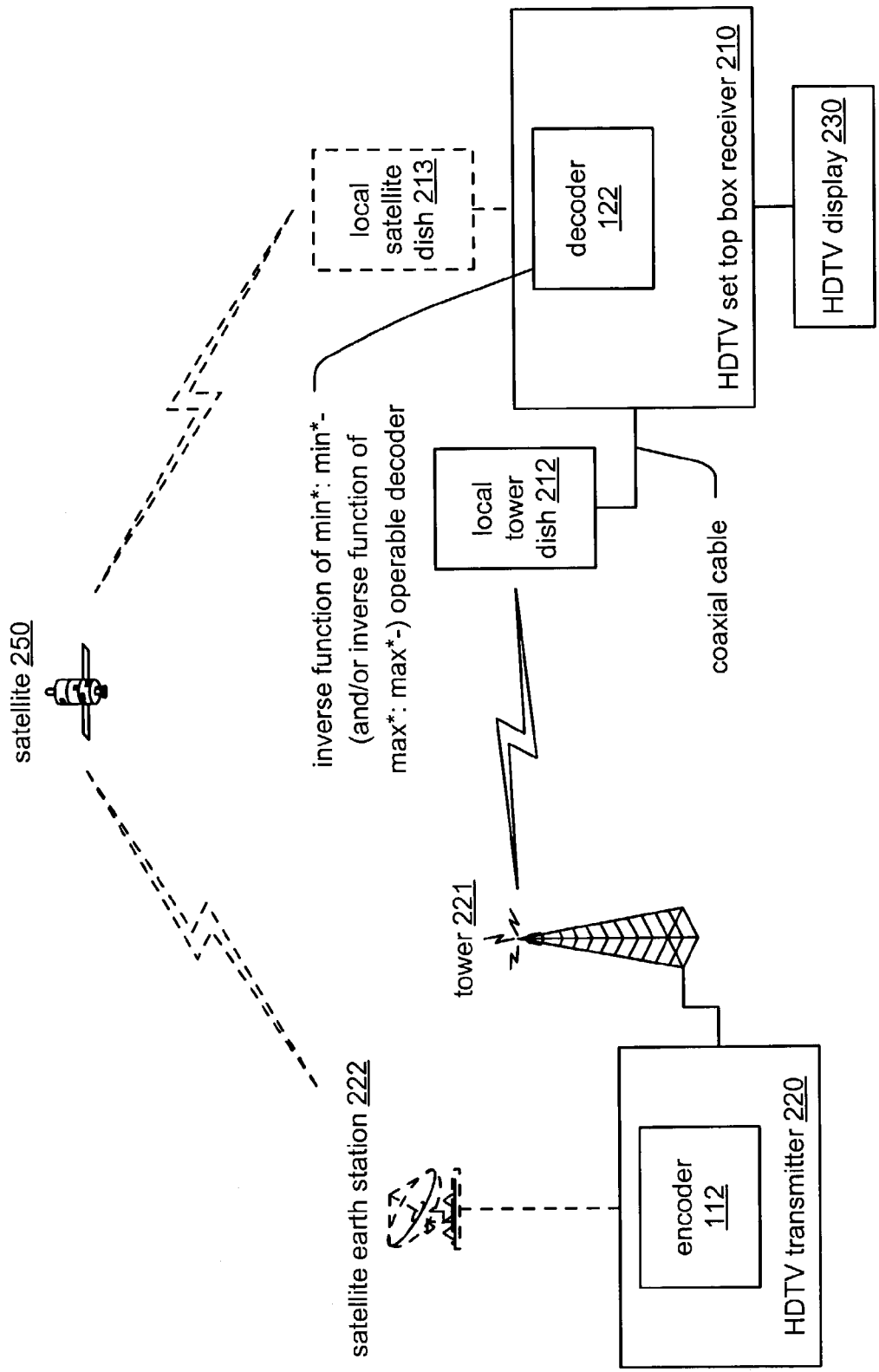
FIG. 2 is a system diagram illustrating an embodiment of a High Definition Television (HDTV) communication system that is built according to the invention.

FIG. 2 is a system diagram illustrating an embodiment of a High Definition Television HDTV communication system 200 that is built according to the invention. An HDTV transmitter 220 is communicatively coupled to a tower 221. The HDTV transmitter 220, using its tower 221, transmits a signal to a local tower dish 212 via a wireless communication channel. The local tower dish 212 communicatively couples to an HDTV set top box receiver 210 via a coaxial cable. The HDTV set top box receiver 210 includes the functionality to receive the wireless transmitted signal that has been received by the local tower dish 212; this may include any transformation and/or down-converting as well to accommodate any up-converting that may have been performed before and during transmission of the signal from the HDTV transmitter 220 and its tower 221.

The HDTV set top box receiver 210 is also communicatively coupled to an HDTV display 230 that is able to display the demodulated and decoded wireless transmitted signals received by the HDTV set top box receiver 210 and its local tower dish 212. The HDTV transmitter 220 (via its tower 221) transmits a signal directly to the local tower dish 412 via the wireless communication channel in this embodiment. In alternative embodiments, the HDTV transmitter 220 may first receive a signal from a satellite 250, using a satellite earth station 222 that is communicatively coupled to the HDTV transmitter 220, and then transmit this received signal to the to the local tower dish 212 via the wireless communication channel. In this situation, the HDTV transmitter 220 operates as a relaying element to transfer a signal originally provided by the satellite 250 that is destined for the HDTV set top box receiver 210. For example, another satellite earth station may first transmit a signal to the satellite 250 from another location, and the satellite 250 may relay this signal to the satellite earth station 222 that is communicatively coupled to the HDTV transmitter 220. The HDTV transmitter 220 performs receiver functionality and then transmits its received signal to the local tower dish 212.

In even other embodiments, the HDTV transmitter 220 employs the satellite earth station 222 to communicate to the satellite 250 via a wireless communication channel. The satellite 250 is able to communicate with a local satellite dish 213; the local satellite dish 213 communicatively couples to the HDTV set top box receiver 210 via a coaxial cable. This path of transmission shows yet another communication path where the HDTV set top box receiver 210 may communicate with the HDTV transmitter 220.

In whichever embodiment and whichever signal path the HDTV transmitter 220 employs to communicate with the HDTV set top box receiver 210, the HDTV set top box receiver 210 is operable to receive communication transmissions from the HDTV transmitter 220.

The HDTV transmitter 220 includes an embodiment of the encoder 112 described above. Similarly, the HDTV set top box receiver 210 includes an embodiment of the decoder 122 described above. Cooperatively, the encoder 112 and the decoder 122 form a codec according to the invention.

The FIG. 2 shows yet another of the many embodiments where coding (encoding and decoding) may be performed according to any one or more of the various embodiments of the invention. The decoding of the decoder 122 is operable to support inverse function of min*:min*– (and/or inverse function of max*:max*–) decoding processing according to the invention.

Figure 3:
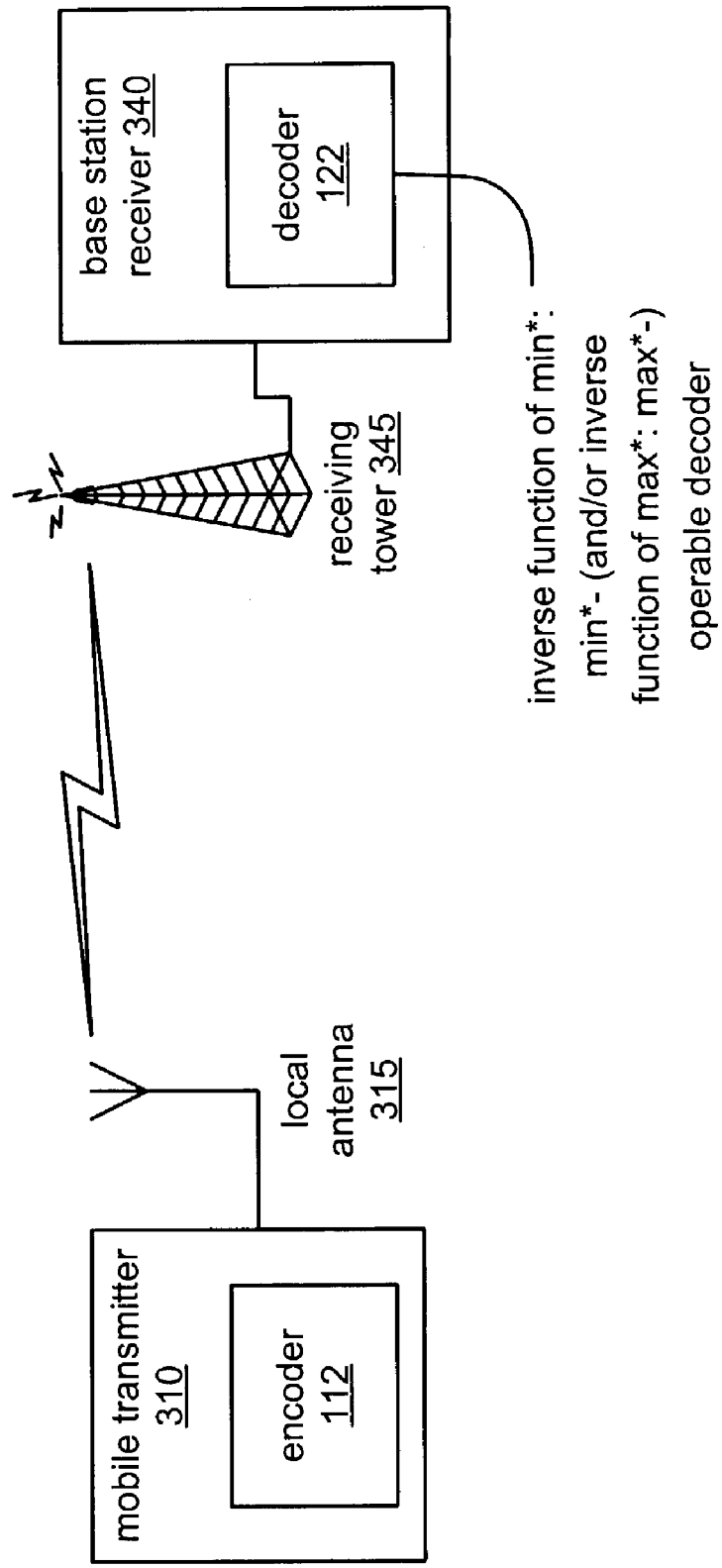
FIG. 3 is a system diagram illustrating an embodiment of a cellular communication system that is built according to the invention.

FIG. 3 is a system diagram illustrating an embodiment of a cellular communication system 300 that is built according to the invention. A mobile transmitter 310 includes a local antenna 315 communicatively coupled thereto. The mobile transmitter 310 may be any number of types of transmitters including a cellular telephone, a wireless pager unit, a mobile computer having transmit functionality, or any other type of mobile transmitter. The mobile transmitter 310 transmits a signal, using its local antenna 315, to a receiving tower 345 via a wireless communication channel. The receiving tower 345 is communicatively coupled to a base station receiver 340; the receiving tower 345 is operable to receive data transmission from the local antenna 315 of the mobile transmitter 310 that have been communicated via the wireless communication channel. The receiving tower 345 communicatively couples the received signal to the base station receiver 340.

The mobile transmitter 310 includes an embodiment of the encoder 112 described above. Similarly, the base station receiver 340 includes an embodiment of the decoder 122 described above. Cooperatively, the encoder 112 and the decoder 122 form a codec according to the invention.

The FIG. 3 shows yet another of the many embodiments where coding (encoding and decoding) may be performed according to any one or more of the various embodiments of the invention. Again, the decoding of the decoder 122 is operable to support inverse function of min*:min*– (and/or inverse function of max*:max*–) decoding processing according to the invention.

Figure 4:
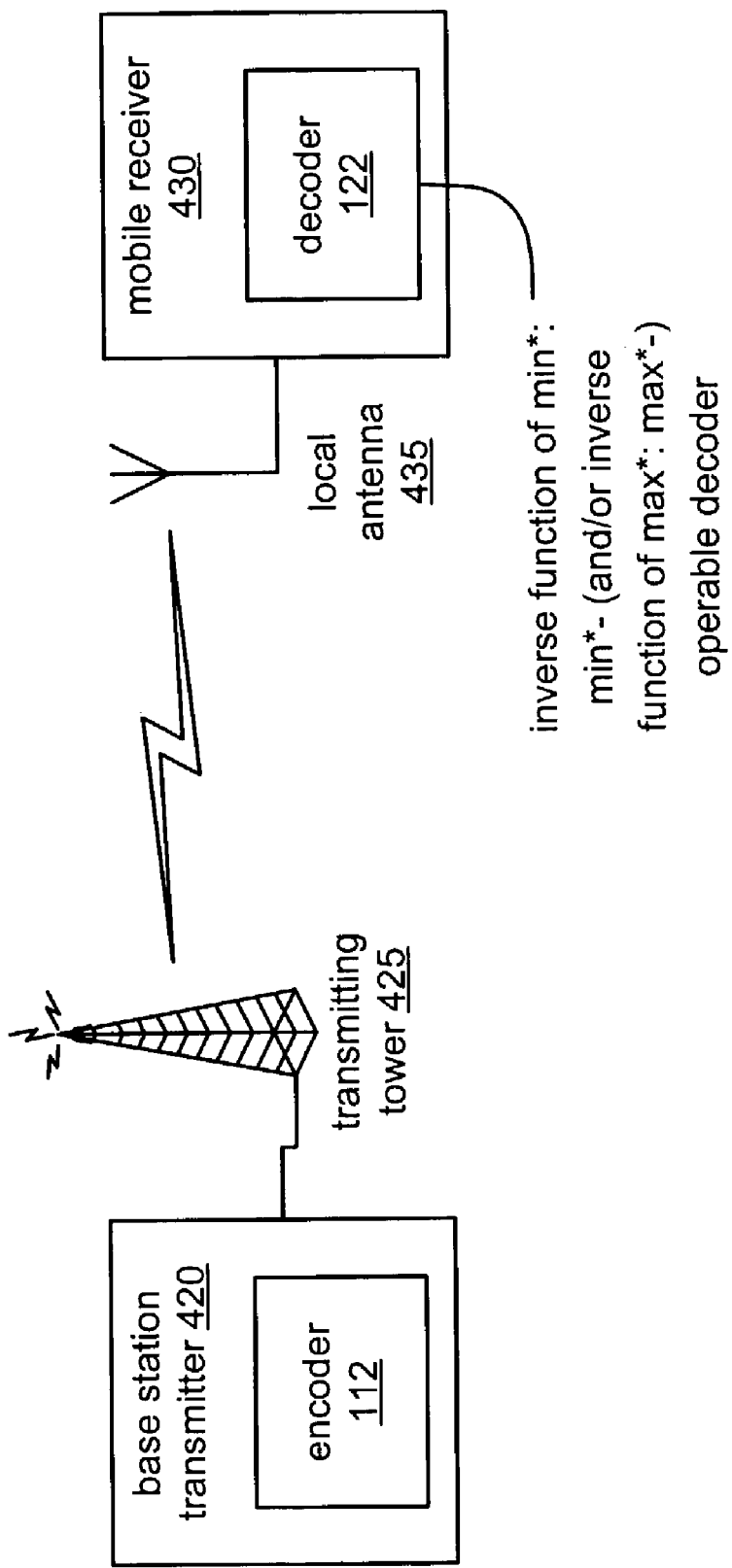
FIG. 4 is a system diagram illustrating another embodiment of a cellular communication system that is built according to the invention.

FIG. 4 is a system diagram illustrating another embodiment of a cellular communication system 400 that is built according to the invention. From certain perspectives, the cellular communication system 400 of the FIG. 4 may be viewed as being the reverse transmission operation of the cellular communication system 300 of the FIG. 3. A base station transmitter 420 is communicatively coupled to a transmitting tower 425. The base station transmitter 420, using its transmitting tower 425, transmits a signal to a local antenna 435 via a wireless communication channel. A mobile receiver 430 includes the local antenna 435 communicatively coupled thereto. The local antenna 435 is communicatively coupled to a mobile receiver 430 so that the mobile receiver 430 may receive transmission from the transmitting tower 435 of the base station transmitter 420 that have been communicated via the wireless communication channel. The local antenna 435 communicatively couples the received signal to the mobile receiver 430. It is noted that the mobile receiver 430 may be any number of types of receivers including a cellular telephone, a wireless pager unit, a mobile computer having receive functionality, or any other type of mobile receiver.

The base station transmitter 420 includes an embodiment of the encoder 112 described above. Similarly, the mobile receiver 430 includes an embodiment of the decoder 122 described above. Cooperatively, the encoder 112 and the decoder 122 form a codec according to the invention.

The FIG. 4 shows yet another of the many embodiments where coding (encoding and decoding) may be performed according to any one or more of the various embodiments of the invention. Again, the decoding of the decoder 122 is operable to support inverse function of min*:min*– (and/or inverse function of max*:max*–) decoding processing according to the invention.

Figure 5:
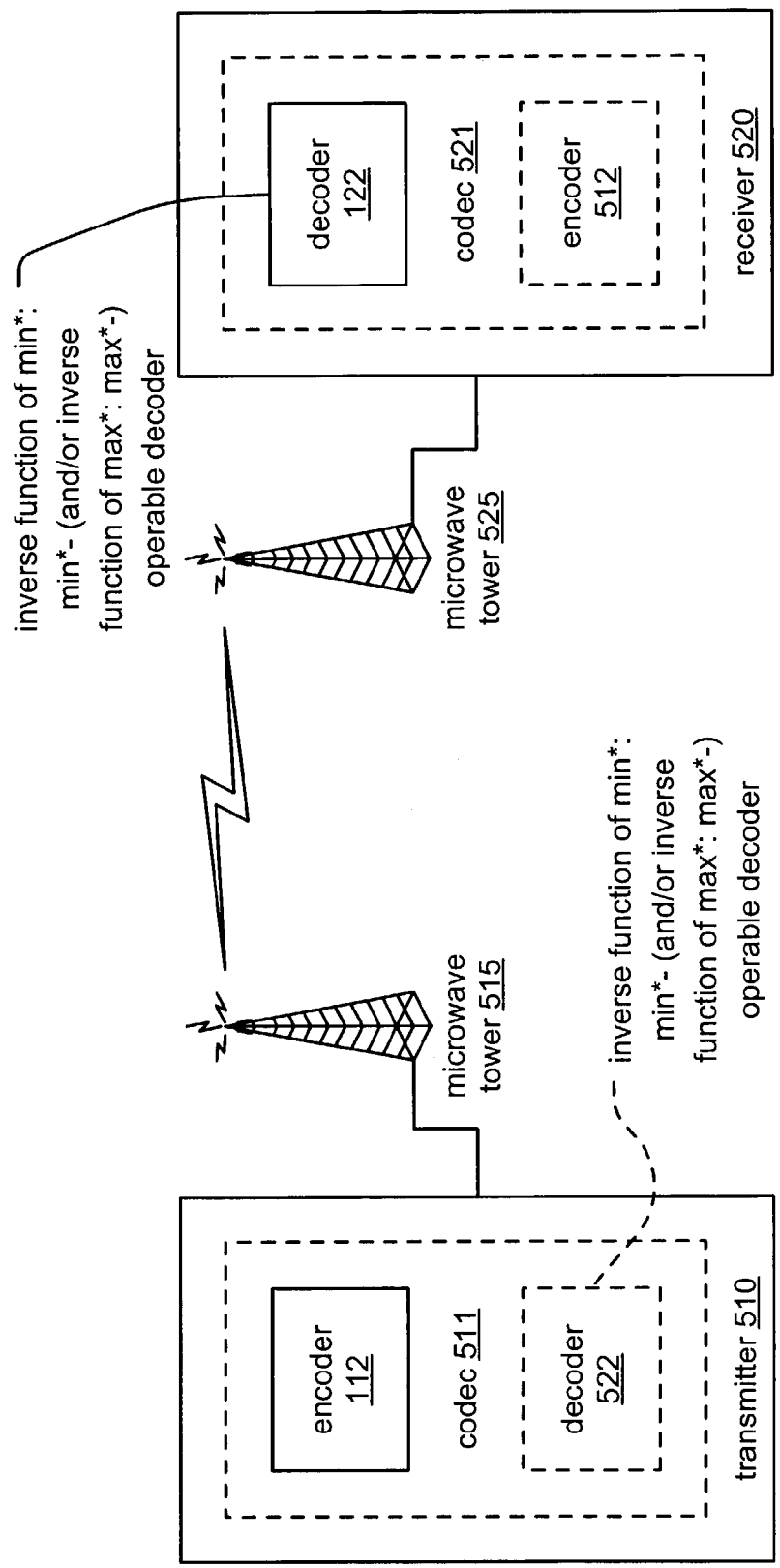
FIG. 5 is a system diagram illustrating an embodiment of a microwave communication system that is built according to the invention.

FIG. 5 is a system diagram illustrating an embodiment of a microwave communication system 500 that is built according to the invention. A transmitter 510 is communicatively coupled to a microwave tower 515. The transmitter 510, using its microwave tower 515, transmits a signal to a microwave tower 525 via a wireless communication channel. A receiver 520 is communicatively coupled to the microwave tower 525. The microwave tower 525 is able to receive transmissions from the microwave tower 515 that have been communicated via the wireless communication channel.

The transmitter 510 includes an embodiment of the encoder 112 described above. Similarly, the receiver 520 includes an embodiment of the decoder 122 described above. Cooperatively, the encoder 112 and the decoder 122 form a codec according to a uni-directional communication implementation of the invention.

However, in a bi-directional communication implementation of the invention, the transmitter 510 also includes an embodiment of a decoder 522; the embodiment of the decoder 522 may be viewed as being duplicative of the decoder 122 within the receiver 520. The encoder 112 and the decoder 522 together from a codec 511 within the transmitter 510. The receiver 520 also includes an embodiment of an encoder 512; the embodiment of the encoder 512 may be viewed as being duplicative of the encoder 112 within the transmitter 510. The decoder 122 and the encoder 512 together form a codec 521 within the receiver 520.

The embodiment of the invention described within the FIG. 5 shows an embodiment where a codec, built according to the invention, may be viewed as within a single device (such as the codec 511 within the transmitter 510 or the codec 521 within the receiver 520) or as being distributed across two separate devices, namely, the transmitter 510 and the receiver 520.

The FIG. 5 shows yet another of the many embodiments where coding (encoding and decoding) may be performed according to any one or more of the various embodiments of the invention. Again, the decoding of the decoders 122 and 522 is operable to support inverse function of min*:min*- (and/or inverse function of max*:max*-) decoding processing according to the invention.

Figure 6:
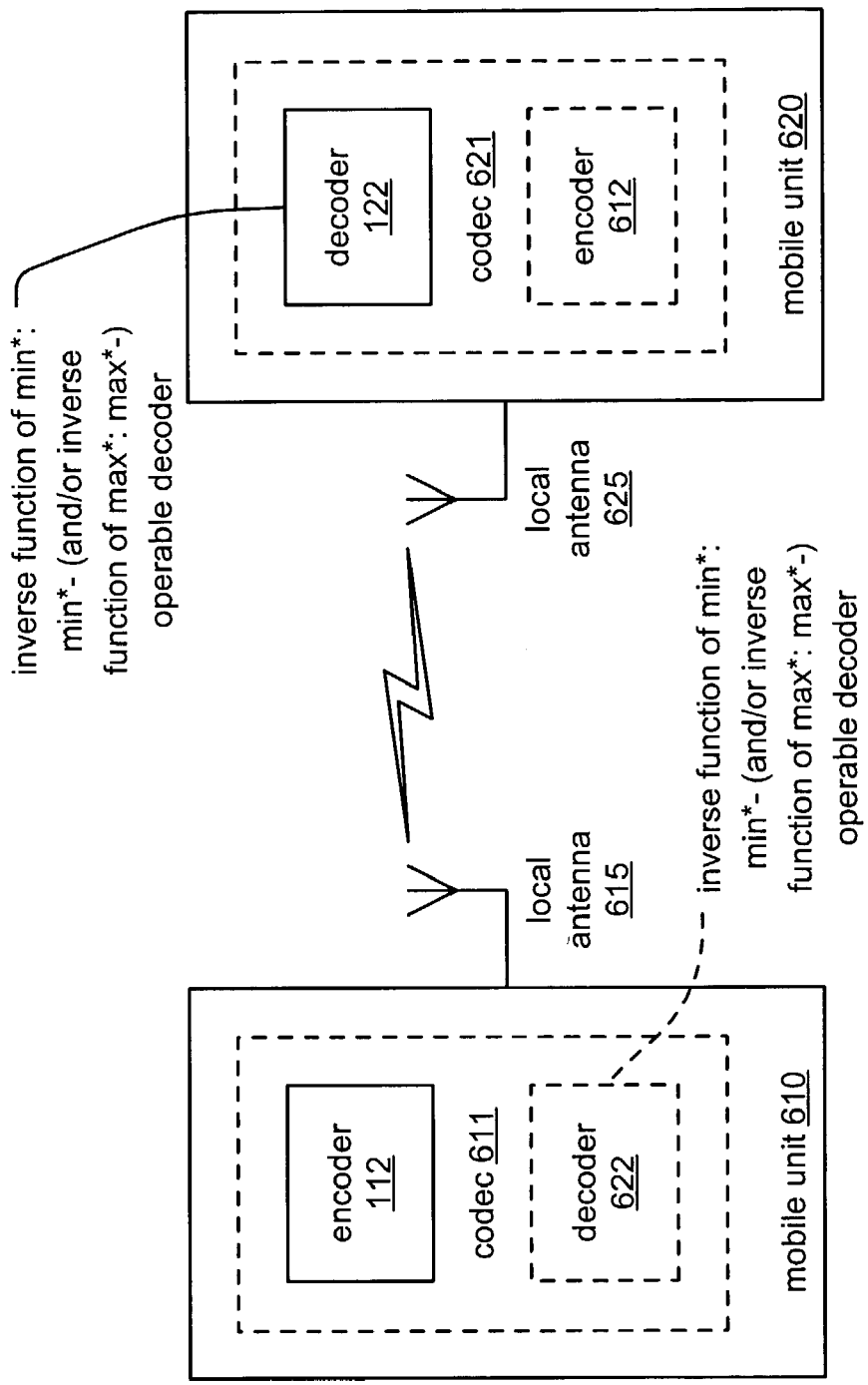
FIG. 6 is a system diagram illustrating an embodiment of a point-to-point communication system that is built according to the invention.

FIG. 6 is a system diagram illustrating an embodiment of a point-to-point communication system 600 that is built according to the invention. A mobile unit 610 includes a local antenna 615 communicatively coupled thereto. The mobile unit 610, using its local antenna 615, transmits a signal to a local antenna 625 via a wireless communication channel. A mobile unit 620 includes the local antenna 625 communicatively coupled thereto. The mobile unit 620 may receive transmissions from the mobile unit 610 that have been communicated via the wireless communication channel.

The mobile unit 610 includes an embodiment of the encoder 112 described above. Similarly, the mobile unit 620 includes an embodiment of the decoder 122 described above. Cooperatively, the encoder 112 and the decoder 122 form a codec according to a uni-directional communication implementation of the invention.

However, in a bi-directional communication implementation of the invention, the mobile unit 610 also includes an embodiment of a decoder 622; the embodiment of the decoder 622 may be viewed as being duplicative of the decoder 122 within the mobile unit 620. The encoder 112 and the decoder 622 together form a codec 611 within the mobile unit 610. The mobile unit 620 also includes an embodiment of an encoder 612; the embodiment of the encoder 612 may be viewed as being duplicative of the encoder 112 within the mobile unit 610. The decoder 122 and the encoder 612 together form a codec 621 within the mobile unit 620.

The embodiment of the invention described within the FIG. 6 shows an embodiment where a codec, built according to the invention, may be viewed as within a single device (such as the codec 611 within the mobile unit 610 or the codec 621 within the mobile unit 610) or as being distributed across two separate devices, namely, the mobile unit 610 and the mobile unit 620.

The FIG. 6 shows yet another of the many embodiments where coding (encoding and decoding) may be performed according to any one or more of the various embodiments of the invention. Again, the decoding of the decoders 122 and 622 is operable to support inverse function of min*:min*- (and/or inverse function of max*:max*-) decoding processing according to the invention.

Figure 7:
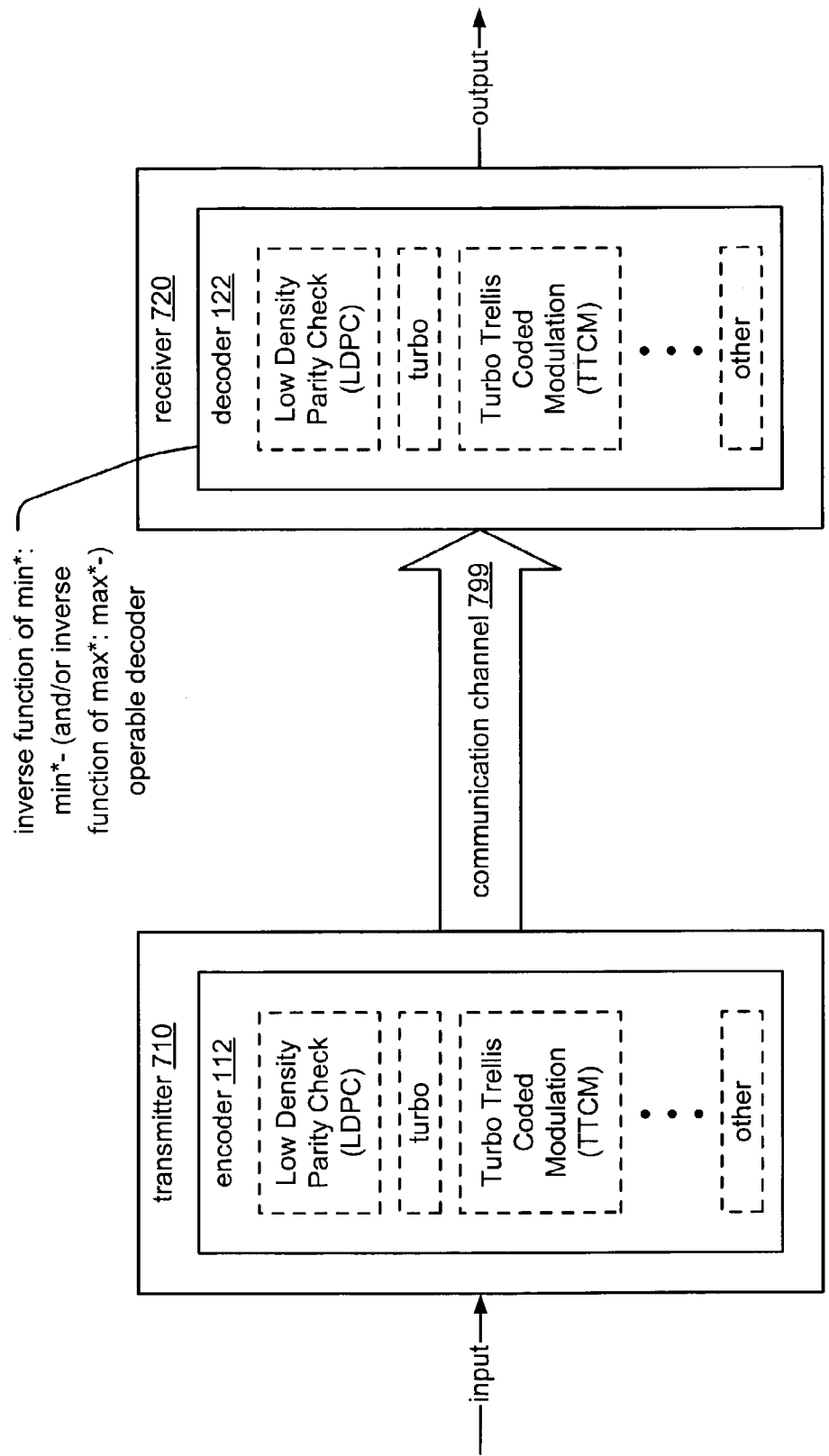
FIG. 7 is a system diagram illustrating an embodiment of a uni-directional communication system, employing inverse function of min*:min*− (or alternatively, inverse function of max*:max*−) decoding processing, that is built according to the invention.

FIG. 7 is a system diagram illustrating an embodiment of a uni-directional communication system 700, employing inverse function of min*:min*- (or alternatively, inverse function of max*:max*-) decoding processing, that is built according to the invention. A transmitter 710 communicates with a receiver 720 via a uni-directional communication channel 799. The unit-directional communication channel 799 may be a wireline (or wired) communication channel or a wireless communication channel without departing from the scope and spirit of the invention. The wired media by which the uni-directional communication channel 799 may be implemented are varied, including coaxial cable, fiber-optic cabling, and copper cabling, among other types of "wiring." Similarly, the wireless manners in which the uni-directional communication channel 799 may be implemented are varied, including satellite communication, cellular communication, microwave communication, and radio communication, among other types of wireless communication.

The transmitter 710 includes an embodiment of the encoder 112. The encoder 112 is operable to support any one of a variety of codes including Low Density Parity Check (LDPC) code, turbo code, Turbo Trellis Coded Modulation (TTCM), . . . , and/or some other code whose decoding involves calculating a minimal or maximal value.

Similarly, the receiver 720 includes an embodiment of the decoder 122. The decoder 122 is operable to support inverse function of min*:min*- (and/or inverse function of max*:max*-) decoding processing that is used by any one of a variety of codes including LDPC code, turbo code, TTCM, . . . , and/or some other code whose decoding involves calculating a minimal or maximal value. Cooperatively, the encoder 112 and the decoder 122 form a codec according to the invention.

The FIG. 7 shows yet another of the many embodiments where coding (encoding and decoding) may be performed according to any one or more of the various embodiments of the invention. Again, the decoding of the decoder 122 is operable to support inverse function of min*:min*- (and/or inverse function of max*:max*-) decoding processing according to the invention.

Figure 8:
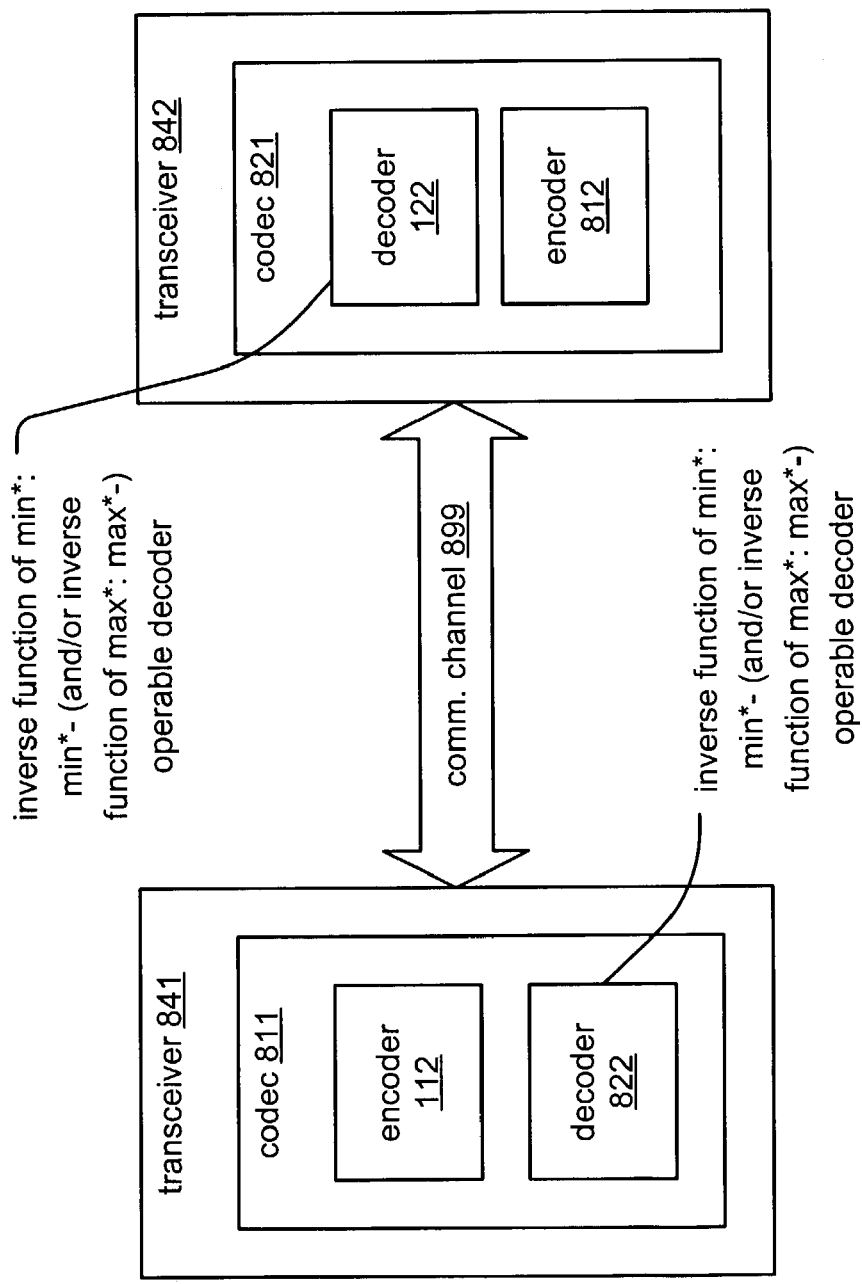
FIG. 8 is a system diagram illustrating an embodiment of a bi-directional communication system, employing inverse function of min*:min*− (or alternatively, inverse function of max*:max*−) decoding processing, that is built according to the invention.

FIG. 8 is a system diagram illustrating an embodiment of a bi-directional communication system 800, employing inverse function of min*:min*- (or alternatively, inverse function of max*:max*-) decoding processing, that is built according to the invention. A transceiver 841 and a transceiver 842 are able to communicate with one another via a bi-directional communication channel 899. The bi-directional communication channel 899 may be a wireline (or wired) communication channel or a wireless communication channel without departing from the scope and spirit of the invention. The wired media by which the bi-directional communication channel 899 may be implemented are varied, including coaxial cable, fiber-optic cabling, and copper cabling, among other types of "wiring." Similarly, the wireless manners in which the bi-directional communication channel 899 may be implemented are varied, including satellite communication, cellular communication, microwave communication, and radio communication, among other types of wireless communication.

The transceiver 841 includes a codec 811 that includes an encoder 112 and a decoder 822. Similarly, transceiver 842 includes a codec 821 that includes a decoder 122 and an encoder 812. The codec 811 and the codec 821 may be viewed as being duplicative of one another within the transceivers 841 and 842.

The FIG. 8 shows yet another of the many embodiments where coding (encoding and decoding) may be performed according to any one or more of the various embodiments of the invention. Again, the decoding of the decoders 122 and 822 is operable to support inverse function of min*:min*– (and/or inverse function of max*:max*–) decoding processing according to the invention.

Figure 9:
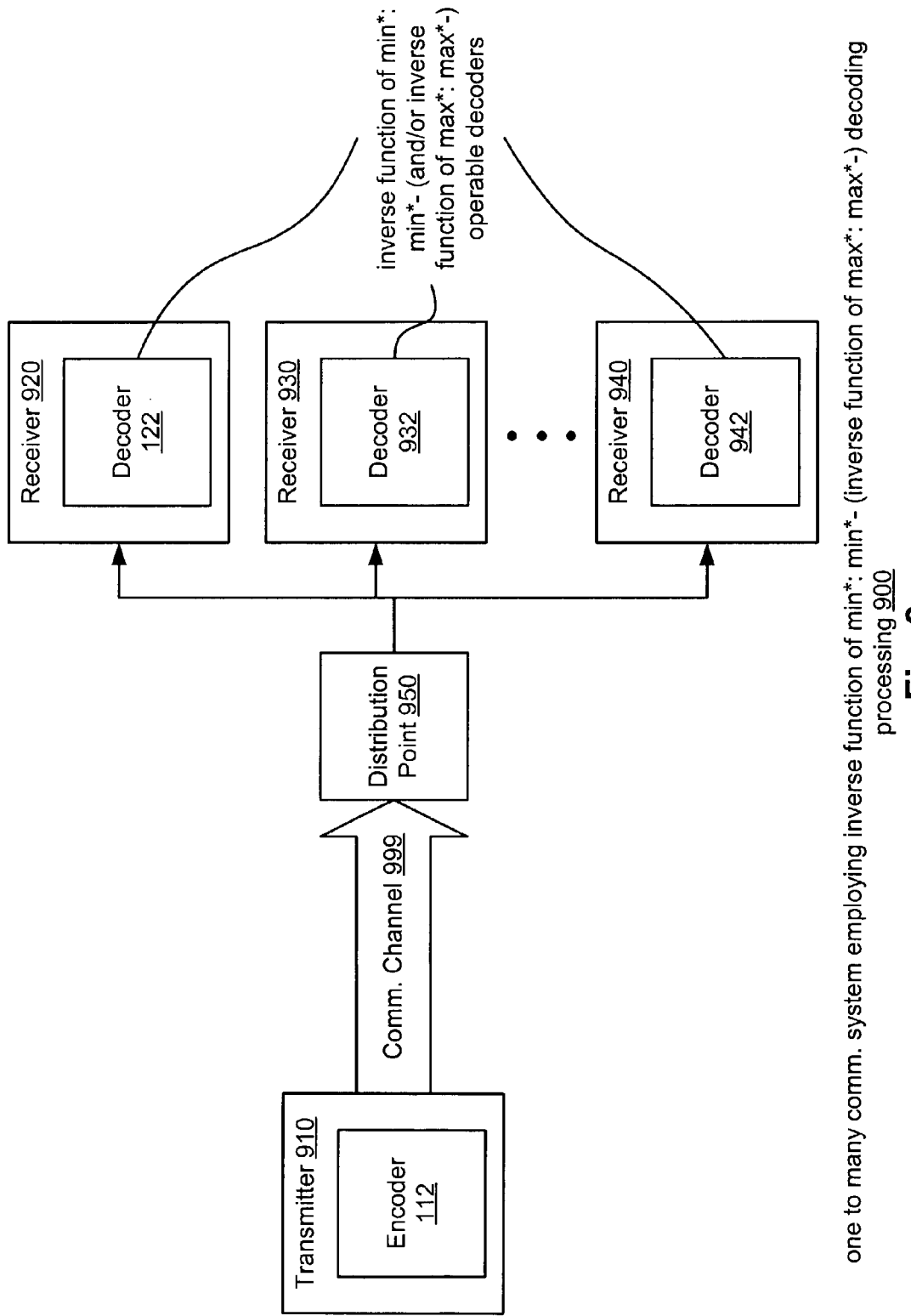
FIG. 9 is a system diagram illustrating an embodiment of a one to many communication system, employing inverse function of min*:min*− (or alternatively, inverse function of max*:max*−) decoding processing, that is built according to the invention.

FIG. 9 is a system diagram illustrating an embodiment of a one to many communication system 900, employing inverse function of min*:min*– (or alternatively, inverse function of max*:max*–) decoding processing, that is built according to the invention. A transmitter 910 is able to communicate, via broadcast in certain embodiments, with a number of receivers, shown as receivers 910, 920, ..., and 940 via a uni-directional communication channel 999. The uni-directional communication channel 999 may be a wireless (or wired) communication channel or a wireless communication channel without departing from the scope and spirit of the invention. The wired media by which the bi-directional communication channel 999 may be implemented are varied, including coaxial cable, fiber-optic cabling, and copper cabling, among other types of "wiring." similarly, the wireless manners in which the bi-directional communication channel 999 may be implemented are varied, including satellite communication, cellular communication, microwave communication, and radio communication, among other types of wireless communication.

A distribution point 950 is employed within the one to many communication system 900 to provide the appropriate communication to the receivers 910, 920, ..., and 940. In certain embodiments, the receivers 910, 920, ..., and 940 each receive the same communication and individually discern which portion of the total communication is intended for themselves.

The transmitter 910 includes an embodiment of the encoder 112. Similarly, each of the receivers 910, 920, ..., and 940 includes an embodiment of the decoder; specifically, the receiver 920 includes an embodiment of the decoder 122; the receiver 930 includes an embodiment of the decoder 932; and the receiver 940 includes an embodiment of the decoder 942. Cooperatively, the encoder 112 and each of the decoders 122, 932, ..., and 942 form codecs according to the invention. Each of the decoders 122, 932, ..., and 942 is operable to support inverse function of min*:min*– (and/or inverse function of max*:max*–) decoding processing according to the invention.

The FIG. 9 shows yet another of the many embodiments where coding (encoding and decoding) may be performed according to any one or more of the various embodiments of the invention. Again, the decoding of the decoders 122 and 622 is operable to support inverse function of min*:min*– (and/or inverse function of max*:max*–) decoding processing according to the invention.

Figure 10:
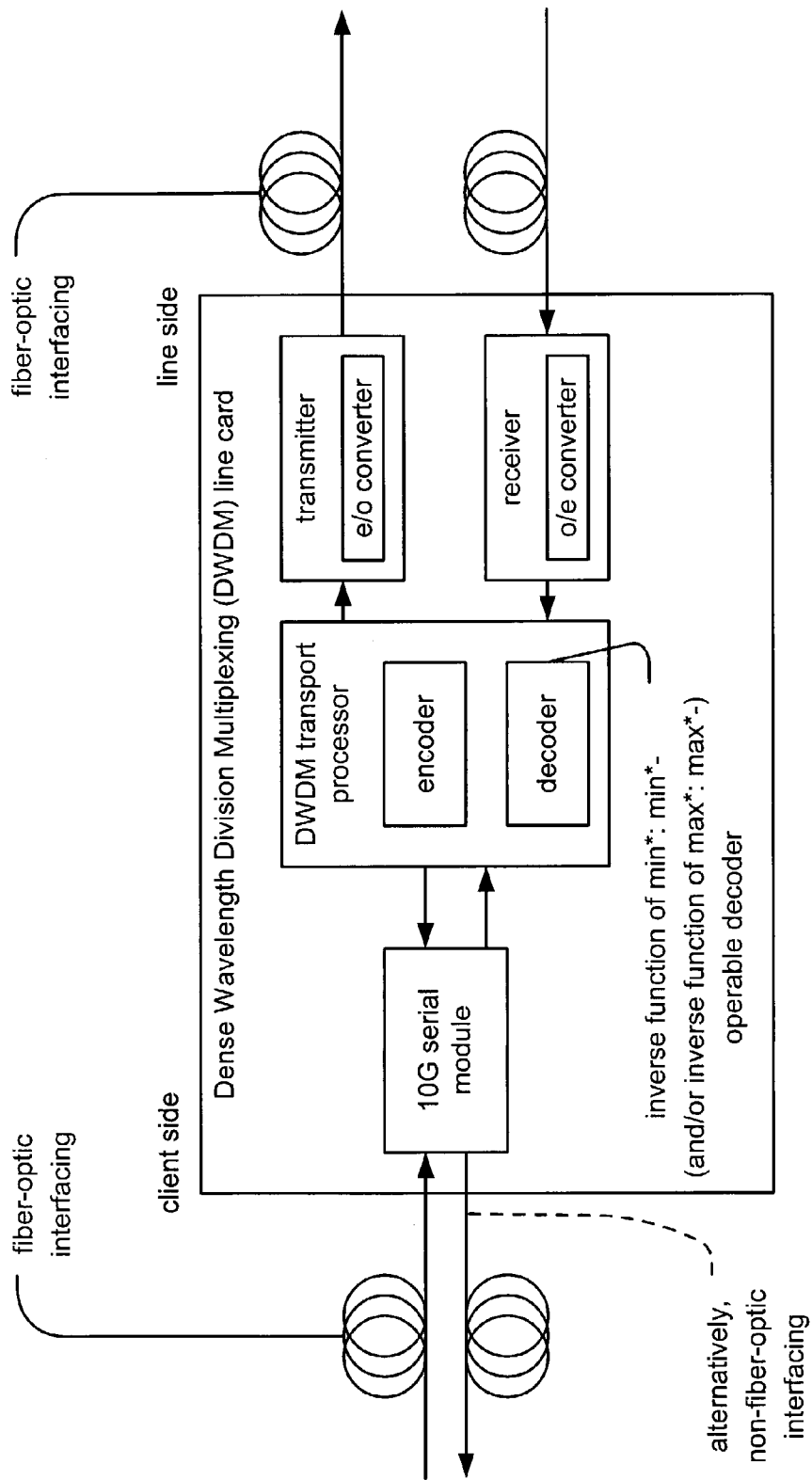
FIG. 10 is a system diagram illustrating an embodiment of a fiber-optic communication system that is built according to the invention.

FIG. 10 is a system diagram illustrating an embodiment of a fiber-optic communication system that is built according to the invention. The fiber-optic communication system is operable to support inverse function of min*:min*– (and/or inverse function of max*:max*–) decoding processing according to the invention. The fiber-optic communication system includes a Dense Wavelength Division Multiplexing (DWDM) line card that is interposed between a line side and a client side.

DWDM is a technology that has gained increasing interest recently. From both technical and economic perspectives, the ability to provide potentially unlimited transmission capacity is the most obvious advantage of DWDM technology. The current investment already made within fiber-optic infrastructure can not only be preserved when using DWDM, but it may even be optimized by a factor of at least 32. As demands change, more capacity can be added, either by simple equipment upgrades or by increasing the number of wavelengths (lambdas) on the fiber-optic cabling itself, without expensive upgrades. Capacity can be obtained for the cost of the equipment, and existing fiber plant investment is retained. From the bandwidth perspective, some of the most compelling technical advantage of DWDM can be summarized as follows:

The transparency of DWDM: Because DWDM is a physical layer architecture (PHY), it can transparently support both time division multiplexing (TDM) and data formats such as asynchronous transfer mode (ATM), Gigabit Ethernet, ESCON, and Fibre Channel with open interfaces over a common physical layer.

The scalability of DWDM: DWDM can leverage the abundance of dark fiber in many metropolitan area and enterprise networks to quickly meet demand for capacity on point-to-point links and on spans of existing SONET/SDH rings.

The dynamic provisioning capabilities of DWDM: the fast, simple, and dynamic provisioning of network connections give providers the ability to provide high-bandwidth services in days rather than months.

Fiber-optic interfacing is employed at each of the client and line sides of the DWDM line card. The DWDM line card includes a transport processor that includes functionality to support DWDM long haul transport, DWDM metro transport, next-generation SONET/SDH multiplexers, digital cross-connects, and fiber-optic terminators and test equipment. On the line side, the DWDM line card includes a transmitter, that is operable to perform electrical to optical conversion for interfacing to an optical medium, and a receiver, that is operable to perform optical to electrical conversion for interfacing from the optical medium. On the client side, the DWDM line card includes a 10G serial module. That is operable to communicate with any other devices on the client side of the fiber-optic communication system using a fiber-optic interface. Alternatively, the interface may be implemented using non-fiber-optic media, including copper cabling and/or some other type of interface medium.

The DWDM transport processor of the DWDM line card includes a decoder that is used to decode received signals from either one or both of the line and client sides and an encoder that is used to encode signals to be transmitted to either one or both of the line and client sides. The decoder is operable to support inverse function of min*:min*– (and/or inverse function of max*:max*–) decoding processing according to the invention. The FIG. 10 shows yet another of the many embodiments where a device may employ inverse function of min*:min*– (and/or inverse function of max*:max*–) decoding processing according to any one or more of the various embodiments of the invention.

Figure 11:
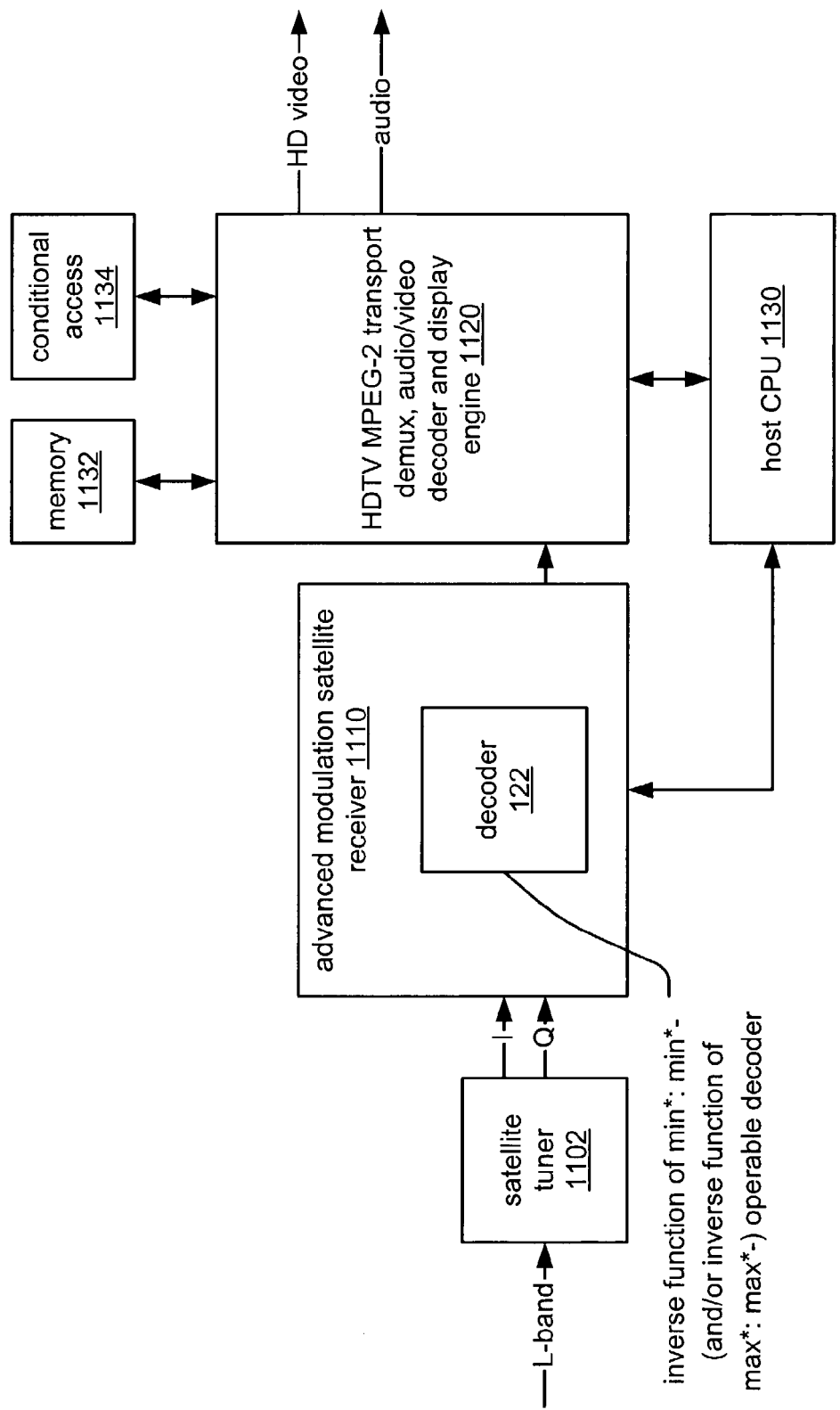
FIG. 11 is a system diagram illustrating an embodiment of a satellite receiver set-top box system that is built according to the invention.

FIG. 11 is a system diagram illustrating an embodiment of a satellite receiver set-top box system 1100 that is built according to the invention. The satellite receiver set-top box system 1100 includes an advanced modulation satellite receiver 1110 that is implemented in an all digital architecture. The satellite receiver set-top box system 1100 includes a satellite tuner 1102 that receives a signal via the L-band. The satellite tuner 1102 extracts I,Q (in-phase and quadrature) components from a signal received from the L-band and provides them to the advanced modulation satellite receiver 1110. The advanced modulation satellite receiver 1110 includes an embodiment of the decoder 112. The decoder 112 is operable to support inverse function of min*:min*– (and/or inverse function of max*:max*–) decoding processing according to the invention.

The advanced modulation satellite receiver 1110 communicatively couples to an HDTV MPEG-2 (Motion Picture Expert Group) transport de-mux, audio/video decoder and display engine 1120. Both the advanced modulation satellite receiver 1110 and the HDTV MPEG-2 transport de-mux, audio/video decoder and display engine 1020 communicatively couple to a host central processing unit (CPU) 1130. The HDTV MPEG-2 transport de-mux, audio/video decoder and display engine 1120 also communicatively couples to a memory module 1132 and a conditional access functional block 1134. The HDTV MPEG-2 transport de-mux, audio/video decoder and display engine 1120 provide HD video and audio output that may be provided to an HDTV display.

The advanced modulation satellite receiver 1110 is a single-chip digital satellite receiver supporting the decoder 122 that is operable to support inverse function of min*:min*– (and/or inverse function of max*:max*–) decoding processing according to the invention. The advanced modulation satellite receiver 1110 is operable to receive communication provided to it from a transmitter device that includes an encoder according to the invention.

Several of the following Figures describe particular embodiments that may be used to perform min* and/or max* processing that may be employed within decoding processing according to any one of the various codes mentioned above. Before looking at several of these particular embodiments, a brief description of the min* and max* calculations is presented below.

For any real values x and y, we can define the calculation of min* as described below. The min* calculation includes finding an actual minimum and also a natural log base e ($\log_e$=ln) correction factor that will be referred to as "ln" hereinafter.

$$\min{}^*(x,y)=-\ln(e^{-x}+e^{-y}). \quad (EQ\ 1)$$

In general, we define $\min{}^*(x_1, \ldots, x_N)=\min{}^*(\min{}^*(x_1, \ldots, x_{N-1}), x_N)$. Using induction, one can prove that $$\min{}^*(x_1, \ldots, x_N)=-\ln(e^{-x_1}+e^{-x_2}+\ldots+e^{-x_N}).$$

From (EQ 1), we have $$\min{}^*(x, y) = \begin{cases} x - \ln(1 + e^{x-y}), & x \le y \\ y - \ln(1 + e^{x-y}), & x > y \end{cases} = \min(x, y) - \ln(1 + e^{-|x-y|}) \quad (EQ\ 2)$$

This EQ 2 may be simplified as shown below:

$$\min{}^*(x, y)=\min(x,y)-\ln(1+e^{-|x-y|})$$

This simplifies the computation of $-\ln(e^{-x}+e^{-y})$.

Again, the min* and/or max* calculations may be employed anywhere when seeking to determine a minimal/maximal value from among a number of possible values. Each of these calculations includes performing a log correction as well.

The max* calculation is somewhat analogous as described below.

For any real values x and y, define $$\max{}^*(x,y)=\ln(e^x+e^y). \quad (EQ\ 3)$$

In general, $\max{}^*(x_1, \ldots, x_N)=\max{}^*(\max{}^*(x_1, \ldots, x_{N-1}), x_N)$. Using induction, one can prove that $\max{}^*(x_1, \ldots, x_N)=\log(e^{x_1}+e^{x_2}+\ldots+e^{x_N})$. Moreover $$\max{}^*(x,y)=\max(x,y)+\ln(1+e^{-|x-y|}) \quad (EQ\ 4)$$

This simplifies the computation of $\ln(e^x+e^y)$. The max* calculation is introduced by Andrew J. Viterbi in the following paper:

Andrew J. Viterbi, "An Intuitive Justification and a Simplified Implementation of the MAP Decoder for Convolutional Codes," *IEEE Journal on Selected Areas in Communications*, vol. 16, February 1998, pp. 260-264.

Figure 12:
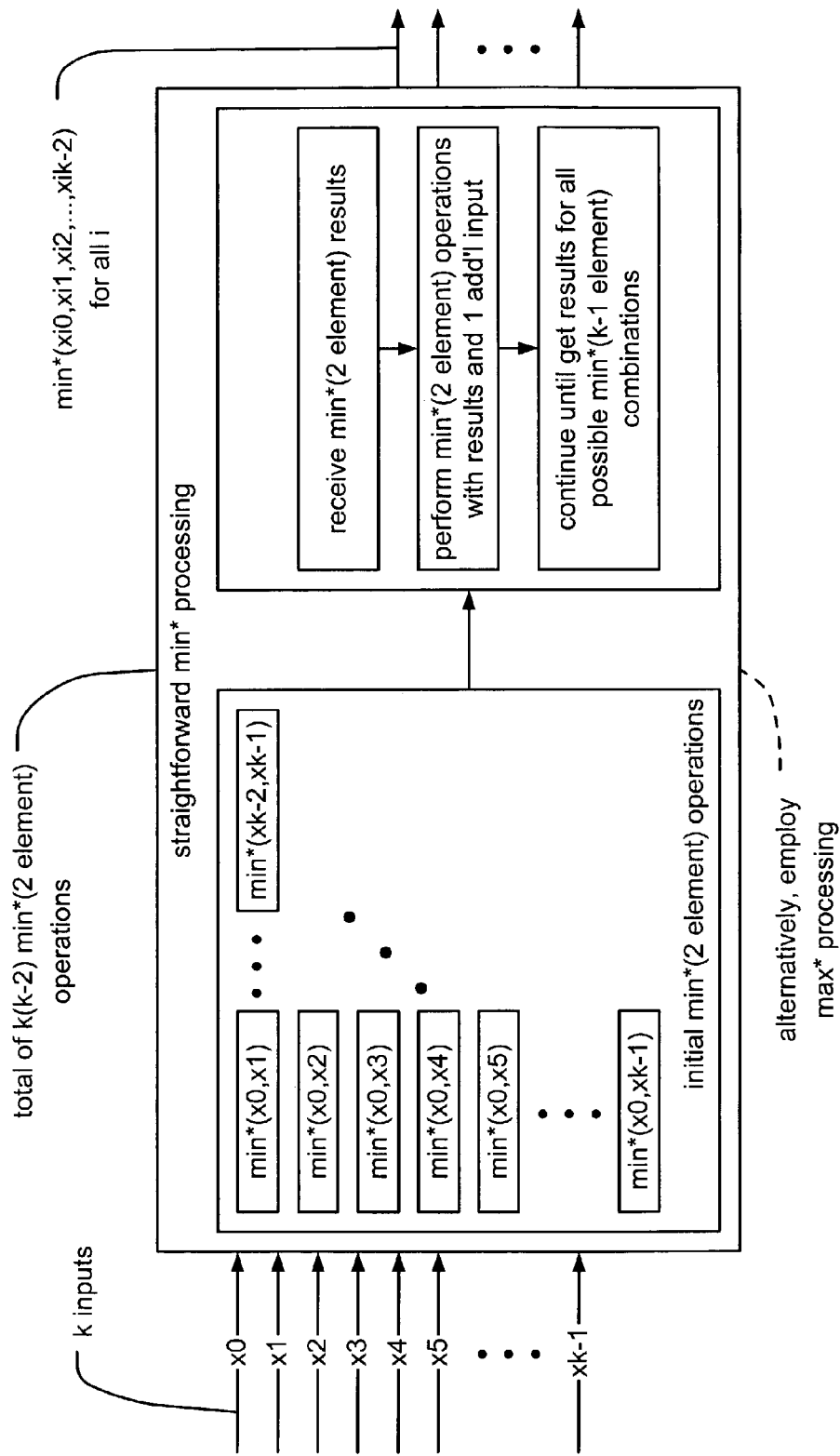
FIG. 12 is a functional block diagram illustrating an embodiment of a straightforward min* functional block that is arranged according to the invention.

FIG. 12 is a functional block diagram illustrating an embodiment of a straightforward min* functional block that is arranged according to the invention. It is also noted that this functional block may alternatively be implemented using max* processing without departing from the scope and spirit of the invention.

In performing the straightforward min* processing, we look at an embodiment where k inputs are provided.

Given k numbers $x_0, x_1, \ldots, x_{k-1}$. The problem is that to compute $\min{}^*(x_{i_0}, x_{i_1}, \ldots, x_{i_{k-2}})$ for all possible choices of k–1 elements among these k input numbers.

There are $$\binom{k}{k-1}=k$$

such combinations. If a straightforward method is used to every k–1 elements min*, then a total of k(k–2) min*(x,y) operations (called min*(2 element)) operations are needed.

Specifically, looking at the k inputs, we may parse the straightforward min* processing into a preliminary/initial processing functional block and subsequent functional block. For example, several initial min*(2 element) operations are performed on the various 2 element combinations of the entire gamut of inputs. Then, after these initial min*(2 element) operations are performed, then the results there from are employed with additional elements, thereby performing additional min*(2 element) operations that will include additional elements. This processing is performed until all of the combinations are calculated for all of the k–1 elements min* operations. This straightforward approach is not an economic or fast way to compute these values. For example, when k=7, total 35 min*(2 element) operations are needed.

One method to reduce the number of min*(2 element) operations is to perform an intermediate result sharing approach described below.

Figure 13:
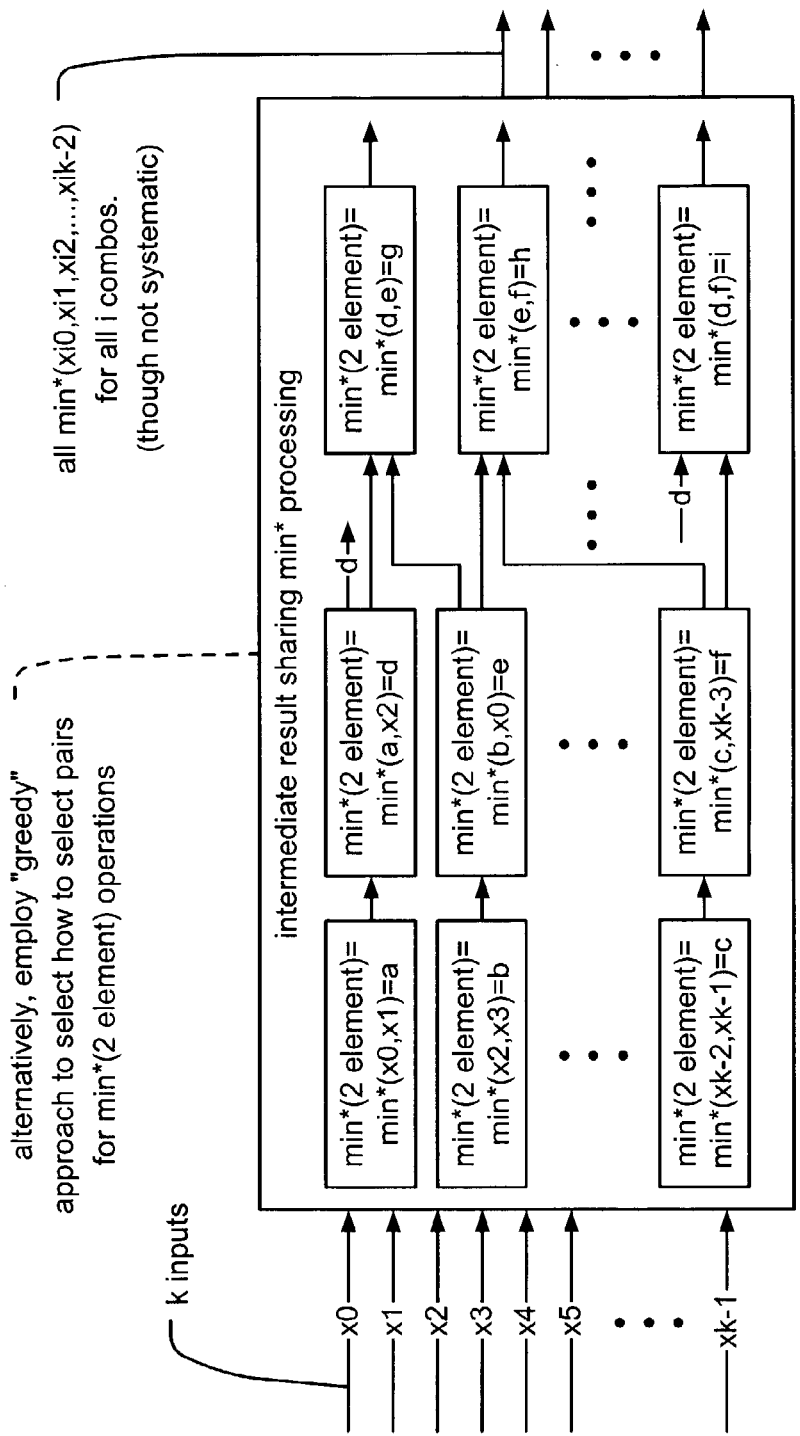
FIG. 13 is a functional block diagram illustrating an embodiment of an intermediate result sharing min* functional block that is arranged according to the invention.

FIG. 13 is a functional block diagram illustrating an embodiment of an intermediate result sharing min* functional block that is arranged according to the invention. This intermediate result sharing approach may be implemented using a "greedy" approach; this is a locally optimal method that may be used to optimize the total gate count of a device that is used to implement the approach. When employing the greedy approach, the best choice is made at the moment. An exhaustive determination is not performed. For example, in the context of deciding which pair of min* elements use in the first min* calculation, the greedy approach looks for the most common element among all of the possible elements pairs. For example, the result of min*(x0, x1) may be the most common used result at the initial assessment. The key point within the greedy approach is that this approach makes a locally optimal choice in the hope that this choice will lead to a globally optimal solution. A greedy choice property may be stated as follows: "A globally optimal solution can be arrived at by making a locally optimal (greedy) choice." However, it is also noted that any number of other approaches may also employ the intermediate result sharing described herein as well.

It is also noted that this functional block may alternatively be implemented using max* processing without departing from the scope and spirit of the invention.

These k inputs are again input; this time, they are input to an intermediate result sharing min* processing functional block. Here, several of the results of min*(2 element) operations are again calculated, but there is a more efficient grouping of these intermediate results when performing min*(2 element) operations. The FIG. 13 shows the grouping of the intermediate results in an effort to provide a more efficient implementation of the intermediate values of a, b, c are generated from the min*(2 element) operations that are performed on the input values; these next min*(2 element) operations are used to generate the next iteration of min*(2 element) operations outputs shown as d, e, f. This process continues until all of the k−1 elements min* operations are performed. However, this intermediate result sharing min* approach is somewhat problematic, in that, it is not a systematic approach. This makes it difficult to perform within decoder embodiments that require systematic operations, and it is very hard to use this approach for larger numbers of k.

Figure 14:
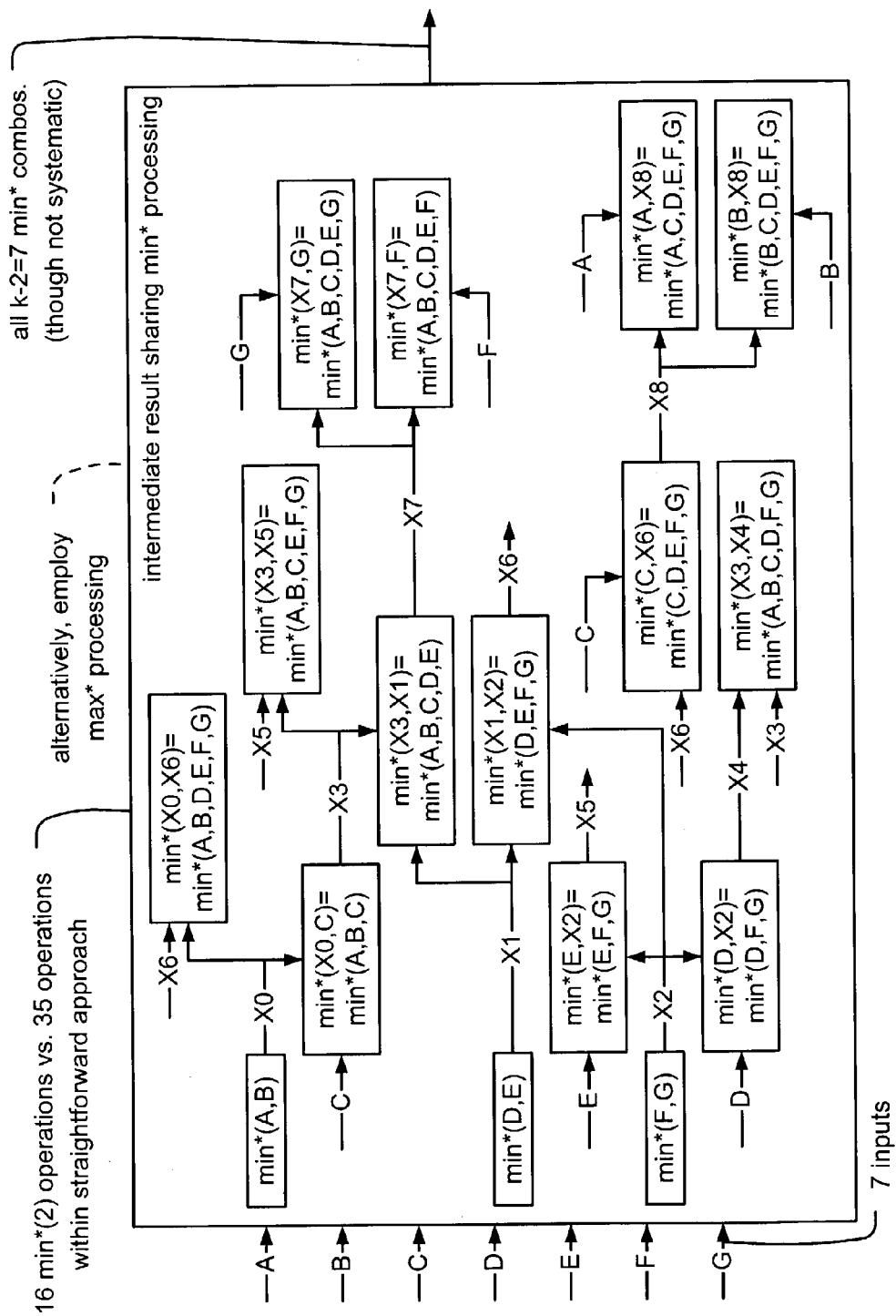
FIG. 14 is a functional block diagram illustrating another embodiment of the intermediate result sharing min* functional block of the FIG. 13 that is arranged according to the invention.

FIG. 14 is a functional block diagram illustrating another embodiment of the intermediate result sharing min* functional block of the FIG. 13 that is arranged according to the invention. This particular embodiment will show the non-systematic embodiment of the FIG. 13 that operates on 7 inputs. This embodiment considers 7 elements A, B, C, D, E, F, G. The 7 possible min* computations of k−1=6 element combinations are shown below:

min*(A,B,C,D,E,F)

min*(A,B,C,D,E,G)

min*(A,B,C,D,F,G)

min*(A,B,C,E,F,G)

min*(A,B,D,E,F,G)

min*(A,C,D,E,F,G) min*(B,C,D,E,F,G)　　　　　(EQ 5)

An efficient selection of sharing the intermediate values is shown below in the following 16 operational steps.

Step 1: Compute $X_0$=min*(A,B);
Step 2: Compute $X_1$=min*(D,E);
Step 3: Compute $X_2$=min*(F,G);
Step 4: Compute $X_3$=min*($X_0$, C) (=min*(A,B,C));
Step 5: Compute $X_4$=min*(D,$X_2$) (=min*(D,F,G));
Step 6: Compute $X_5$=min*(E,$X_1$) (=min*(E,F,G));
Step 7: Compute $X_6$=min*($X_1$,$X_2$) (=min*(D,E,F,G));
Step 8: Compute $X_7$=min*($X_3$,$X_1$) (=min*(A,B,C,D,E));
Step 9: Compute $X_8$=min*(C,$X_2$) (=min*(C,D,E,F,G));
Step 10: compute min*(A,B,C,D,E,F)=min*($X_7$,F);
Step 11: Compute min*((A,B,C,D,E,G)=min*($X_7$,G);
Step 12: Compute min*(A,B,C,D,F,G)=min*($X_3$,$X_4$);
Step 13: Compute min*(A,B,C,E,F,G)=min*($X_3$,$X_5$);
Step 14: Compute min*(A,B,D,E,F,G)=min*($X_0$, $X_6$)
Step 15: Compute min*(A,C,D,E,F,G)=min*(A,$X_8$); and
Step 16: Compute min*(B,C,D,E,F,G)=min*(B,$X_8$).

In this way, total 16 min*(2 element) operations are needed, which is less than half number of the operations of the straightforward min* approach described above. Again, it is noted that this intermediate sharing approach is not a systematic approach making it very hard to use for larger k.

In the following Figures and description, an even faster and systematic approach is introduced that employs min*− and/or max*− processing.

Figure 15:
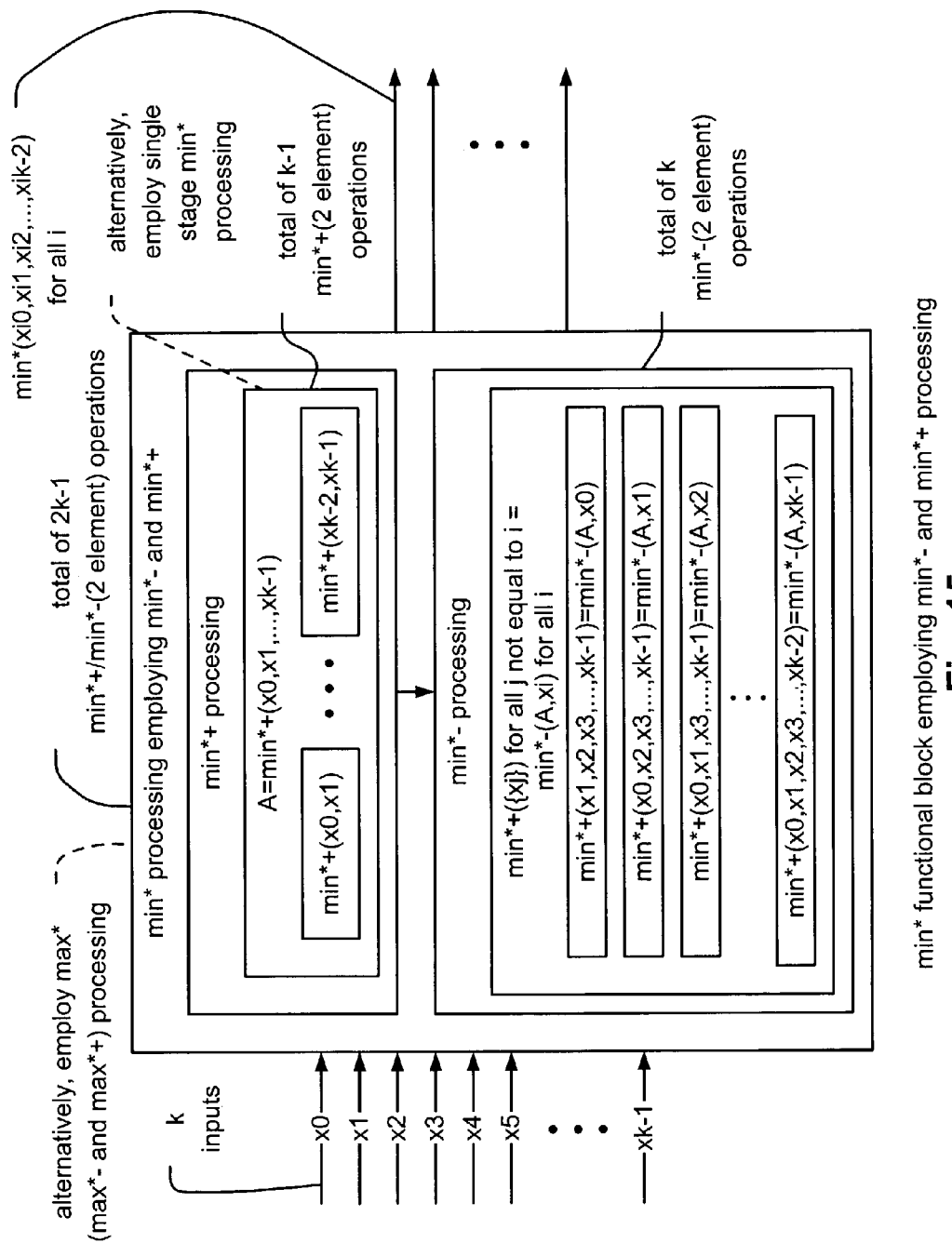
FIG. 15 is a functional block diagram illustrating an embodiment of a min* functional block, employing min*− and min*+ processing, that is arranged according to the invention.

FIG. 15 is a functional block diagram illustrating an embodiment of a min* functional block, employing min*− and min*+ processing, that is arranged according to the invention. The min* processing is further broken down into two separate operations.

The min* operation itself, defined above, is now renamed as being a min*+ operation. Furthermore, the following definition of the min*+ operation may be shown on any real values x and y such that x<y as follows:

$$\text{min}^*-(x,y)=-\ln(e^{-x}-e^{-y}).\qquad\text{(EQ 6)}$$

Then, we have min*−(x,y)=min(x,y)−ln(1−$e^{-|x-y|}$). The complexity of this min*− operation is the same as that of min*(2 element) operation described above.

There is also a very useful property of the min*− operation when compared to the min*+ operation. The min*− operation is an inverse function of the min*+ operation. This operation may be shown below. Since $e^{-x}+e^{-y}>e^{-y}$, we have −ln($e^{-x}+e^{-y}$)<y, thus, min*+(x,y)<y. Therefore, by employing the definitions of min*+ and min*−, the following relationship may be made as follows:

$$\text{min}^*-(\text{min}^*+(x,y),y)=-\ln(e^{\ln(e^{-x}+e^{-y})}-e^{-y})=-\ln(e^{-x})=x\qquad\text{(EQ 7)}$$

This relationship and operation may be employed to provide for significantly reduced computationally complexity than performing straightforward min* processing. Using the relationships introduced above, a min* processing functional block that employs both min*− and min*+ operations may be employed.

It is also noted that a max* processing functional block that employs both max*− and max*+ operations may be alternatively employed. The operations of the max* operations (employing max*− and max*+) is described below:

This process begins by renaming the max* operation as max*+. For example, the max* operation for any real values x and y may defined as the max* operation described above where max*(x,y)=max*+(x,y). The max*− operation, for any real values x and y such that x>y, may be defined as follows:

$$\text{max}^*-(x,y)=\ln(e^x-e^y)\qquad\text{(EQ 8)}$$

Further simplification of the max*− operation may be performed as follows:

max*−(x,y)=max(x,)+ln(1−$e^{-|x-y|}$). The complexity of this operation is the same as that of max*(2 element) operation as well.

There is also a very useful property of the max*− operation when compared to the max*+ operation. The max*− operation is an inverse function of the max*+ operation. This operation may be shown below. Since $e^x+e^y>e^y$, we have ln($e^x+e^y$)<y. Thus, max*+(x,y)>y.

Therefore, by employing the definitions of max*+ and max*−, the following relationship may be made as follows:

$$\max^*-(\max^*+(x,y),y)=\ln(e^{\ln(e^x+e^y)}-e^y)=\ln(e^x)=x \quad (EQ\ 9)$$

This relationship and operation may be employed to provide for significantly reduced computationally complexity than performing straightforward max* processing. Using the relationships introduced above, a max* processing functional block that employs both max*− and max*+ operations may be employed.

The FIG. 15 employs the min* processing that is employed by performing both the min*− and min*+ operations. To illustrate the functionality of this more efficient operation, an illustration of an embodiment that is to perform min* processing on k inputs is again used. To employ the min*+ and min*− processing to perform the total min* processing, min*+ processing is initially performed. In doing so, an intermediate variable A is first calculated using min*+ processing that will subsequently be used to perform the min*+ processing to generate all of the combinations of the k−1 elements of min*.

The min*+ operations begin by calculating the intermediate variable $A=\min^*+(x_0, \ldots, x_{k-1})$. This is performed by performing k−1 min*(2 element) operations. For example, the min*(2 element) operations are shown as min*+(x0,x1), ..., and min*+(xk−2, xk−1) within the FIG. 15. However, the total min* operation requires the calculation of all of the possible k−1 element combinations.

It is also noted that other approaches may be used to calculate the intermediate value of A. One example includes performing the min* calculation using a single stage operation. Alternatively, a parallel approach may also be employed to perform this min* calculation. Other approaches may also be employed without departing from the scope and spirit of the invention.

The relationships of min*− and min*+, described above, is employed to continue the total min* processing. For example, the use of the intermediate variable A is employed to finalize the min* calculations of all of the k−1 element possible combinations. This is performed as follows:

For example, $\min^*+_{j\neq i}(\{x_j\})=\min^*-(A,x_i)$ for all possible i.

A further clarification of this relationship is provided below:

Beginning with $B=\min^*+_{j\neq i}(\{x_j\})$, for $j\neq i$.

Next, the definition of min*+ is employed, and the result of B is min*'ed with each value of $x_i$, for all i. By employing by the inverse function property of EQ 7 (that shows the relationship between min*− and min*+), the result is shown below within EQ 10.

$$B=\min^*-(\min^*+((B,x_i),x_i)=\min^*-(A,x_i) \quad (EQ\ 10)$$

This processing that is employed within the decoding processing is shown within a min*− functional block. For example, using the relationships of min*, that employs min*+ and min*−, may be used to calculate all of the k−1 element possible combinations using only min*−(2 element) operations. This reduced complexity, by breaking down the min* operation into min*+ and min*−, will significantly reduce the computational complexity of the total min* operation as well as significantly conserve processing resources.

Specifically, the min*− calculations are shown below:

$$\min^*-(A,x0)=\min^*+(x1,x2,x3,\ldots,xk-1);$$

$$\min^*-(A,x1)=\min^*+(x0,x2,x3,\ldots,xk-1);$$

$$\min^*-(A,x2)=\min^*+(x0,x1,x3,\ldots,xk-1);\ldots; \text{ and}$$

$$\min^*-(A,xk-1)=\min^*+(x0,x1,x2,x3,\ldots,xk-2).$$

The total number of min*+(2 element) operations to be performed within the min*+ processing functional block includes k−1 operations. In addition, the total number of min*−(2 element) operations to be performed within the min*− processing functional block includes k operations. Therefore, the total number of operations includes k−1+k=2k−1. This gives a tremendous savings when compared to the straightforward approach that requires k(k−2) min*(2 element) operations. This min* approach, by employing min*− and min*+ processing, may also be performed using fewer operations that the intermediate result sharing approach described above.

One additional property of the min* processing that is employed by performing both the min*− and min*+ operations is that it is a systematic approach.

Figure 16:
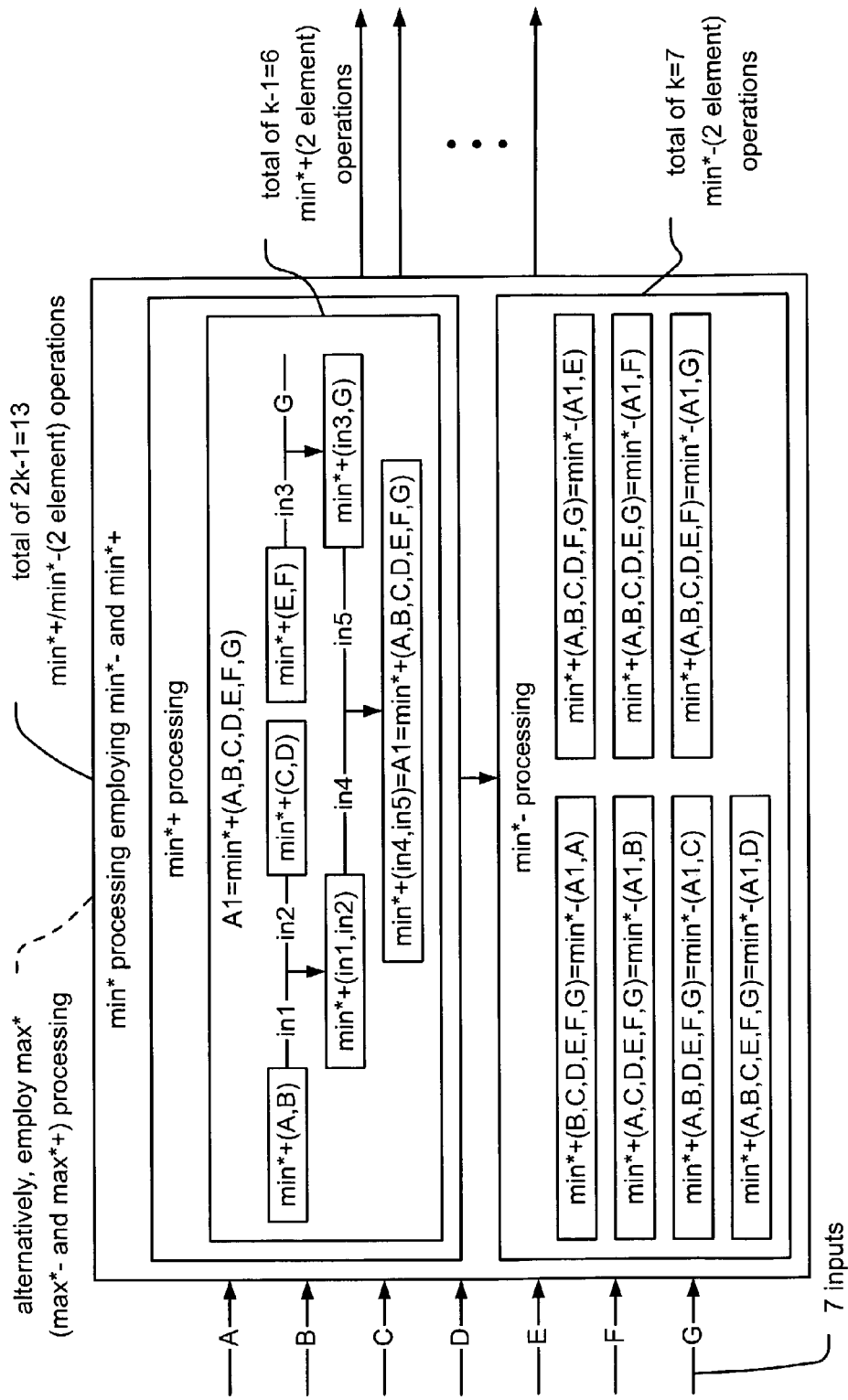
FIG. 16 is a functional block diagram illustrating another embodiment of a min* functional block, employing min*− and min*+ processing, of the FIG. 15 that is arranged according to the invention.

FIG. 16 is a functional block diagram illustrating another embodiment of a min* functional block, employing min*− and min*+ processing, of the FIG. 15 that is arranged according to the invention. This particular embodiment shows the systematic embodiment of the FIG. 16 that operates on 7 inputs. This embodiment considers 7 elements A, B, C, D, E, F, G. The 7 possible min* computations of k−1=6 element combinations, of EQ 5, are once again shown below:

$$\min^*(A,B,C,D,E,F)$$

$$\min^*(A,B,C,D,E,G)$$

$$\min^*(A,B,C,D,F,G)$$

$$\min^*(A,B,C,E,F,G)$$

$$\min^*(A,B,D,E,F,G)$$

$$\min^*(A,C,D,E,F,G)$$

$$\min^*(B,C,D,E,F,G) \quad (EQ\ 5)$$

The min*+ processing is first performed to calculate the A1=min*(A,B,C,D,E,F,G) intermediate result that will subsequently be used to perform min*− processing to calculate all of the min* results shown in the EQ 5. The k−1=6 min*+(2 element) operations employed to do this are shown as follows:

Step 1: min*+(A,B)=in1
Step 2: min*+(C,D)=in2
Step 3: min*+(E,F)=in3
Step 4: min*+(in1,in2)=in4
Step 5: min*+(in3,G)=in5
Step 6: min*+(in4,in5)=min*(A,B,C,D,E,F,G)=A1

This initial processing of the intermediate variable A1 may be viewed as being a parallel approach perform min* calculation.

This intermediate result A1 is then used within a min*− functional block to calculate all of the possible k−1 element combinations. A total number of k=7 operations is performed to do this in this embodiment.

Specifically, the min*− calculations are shown below:
Step 1: min*−(A1,A)=min*+(B,C,D,E,F,G)
Step 2: min*−(A1,B)=min*+(A,C,D,E,F,G)
Step 3: min*−(A1,C)=min*+(A,B,D,E,F,G)
Step 4: min*−(A1,D)=min*+(A,B,C,E,F,G)
Step 5: min*−(A1,E)=min*+(A,B,C,D,F,G)
Step 6: min*−(A1,F)=min*+(A,B,C,D,E,G)
Step 7: min*−(A1,G)=min*+(A,B,C,D,E,F)

As can be seen, a significant reduction of min*(2 element) operations (be they min*+ or min*− operations) is achieved. For example, a total of 2k−1=13 operational steps may be performed. The min* processing, employing both the min*− and min*+ operations, provides for a significant reduction in operational steps. This decoding processing functionality may be employed to provide for a reduction in processing steps within a variety of the codes mentioned above.

It is also noted that the embodiments shown within the FIGS. 15 and 16 may be implemented such they are also backward compatible with the decoding processing performed within the straightforward min* processing and intermediate result sharing min* processing functional blocks within the FIGS. 12, 13, and 14. That is to say, a single decoder may be implemented such that it may support one, two, or all of the straightforward min* processing functionality, the intermediate result sharing min* processing functionality, and the min*+/min*− processing functionality. Alternatively, a single decoder may be implemented such that it may support one, two, or all of the straightforward max* processing functionality, the intermediate result sharing max* processing functionality, and the max*+/max*− processing functionality.

Figure 17:
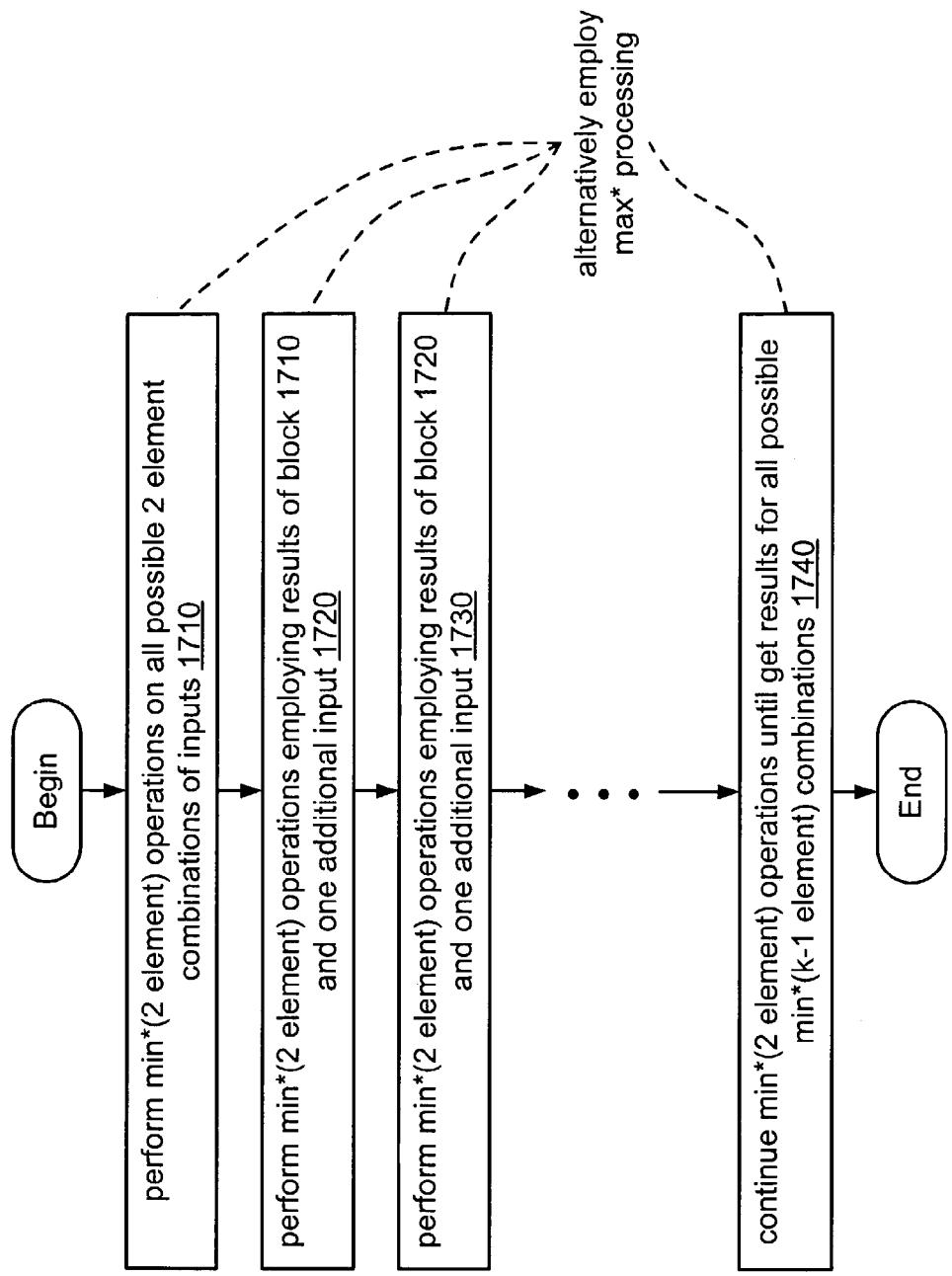
FIG. 17 is an operational flow diagram illustrating an embodiment of a straightforward min* processing method that is performed according to the invention.

FIG. 17 is an operational flow diagram illustrating an embodiment of a straightforward min* processing method that is performed according to the invention. It is also noted that the max* operations may alternatively be employed to perform straightforward processing according to the invention.

As shown in a block 1710, min* operations are performed on all possible 2 element combinations of a number of inputs. Then, continuing on with the method, as shown in a block 1720, min*(2 element) operations are performed on the results of the block 1710 and one additional input selected from the total number of inputs. Again, as shown in a block 1730, min*(2 element) operations are performed on the results of the blocks 1710 and 1720 and one additional input selected form the total number of inputs. As shown in a block 1740, this process continues on until all of the possible min*(k−1 element) combinations have been determined.

Figure 18:
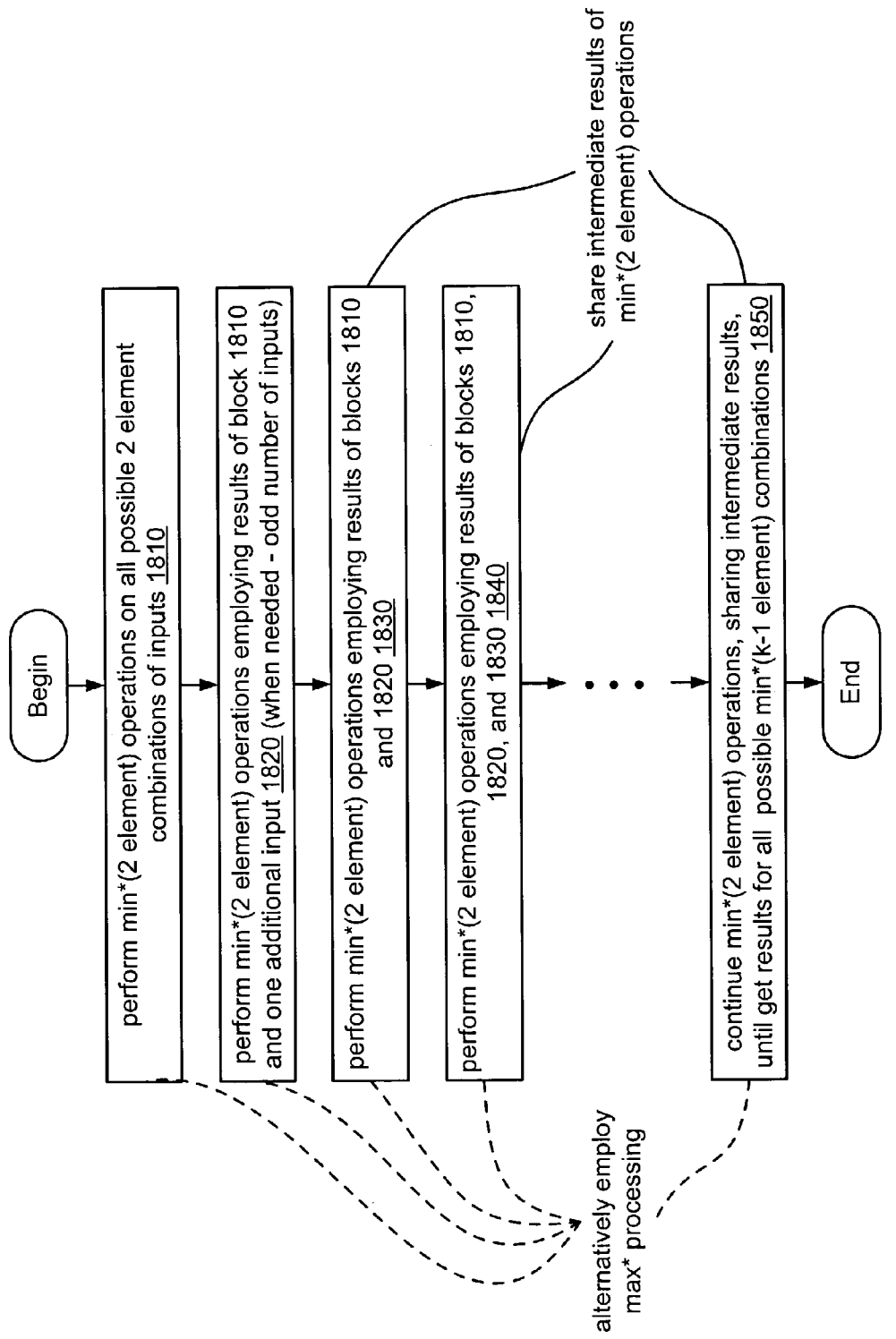
FIG. 18 is an operational flow diagram illustrating an embodiment of an intermediate result sharing min* processing method that is performed according to the invention.

FIG. 18 is an operational flow diagram illustrating an embodiment of an intermediate result sharing min* processing method that is performed according to the invention. It is also noted that the max* operations may alternatively be employed to perform intermediate result sharing processing according to the invention.

As shown in a block 1810, min* operations are performed on all possible 2 element combinations of a number of inputs. Then, as shown in a block 1820, min*(2 element) operations are performed on the results of the block 1810 and one additional input selected from the total number of inputs; this may be performed when there is an odd number of inputs.

Again, as shown in a block 1830, min*(2 element) operations are performed on the results of the blocks 1810 and 1820; the processing within the block 1830 may be viewed as performing intermediate sharing of the results achieved within the blocks 1810 and 1820. Similarly, as shown in a block 1840, min*(2 element) operations are performed on the results of the blocks 1810, 1820, and 1830; the processing within the block 1840 may be viewed as performing intermediate sharing of the results achieved within the blocks 1810, 1820, and 1830. This process continues on sharing the intermediate results of the previous blocks. As shown in a block 1840, this process continues on until all of the possible min*(k−1 element) combinations have been determined.

Figure 19:
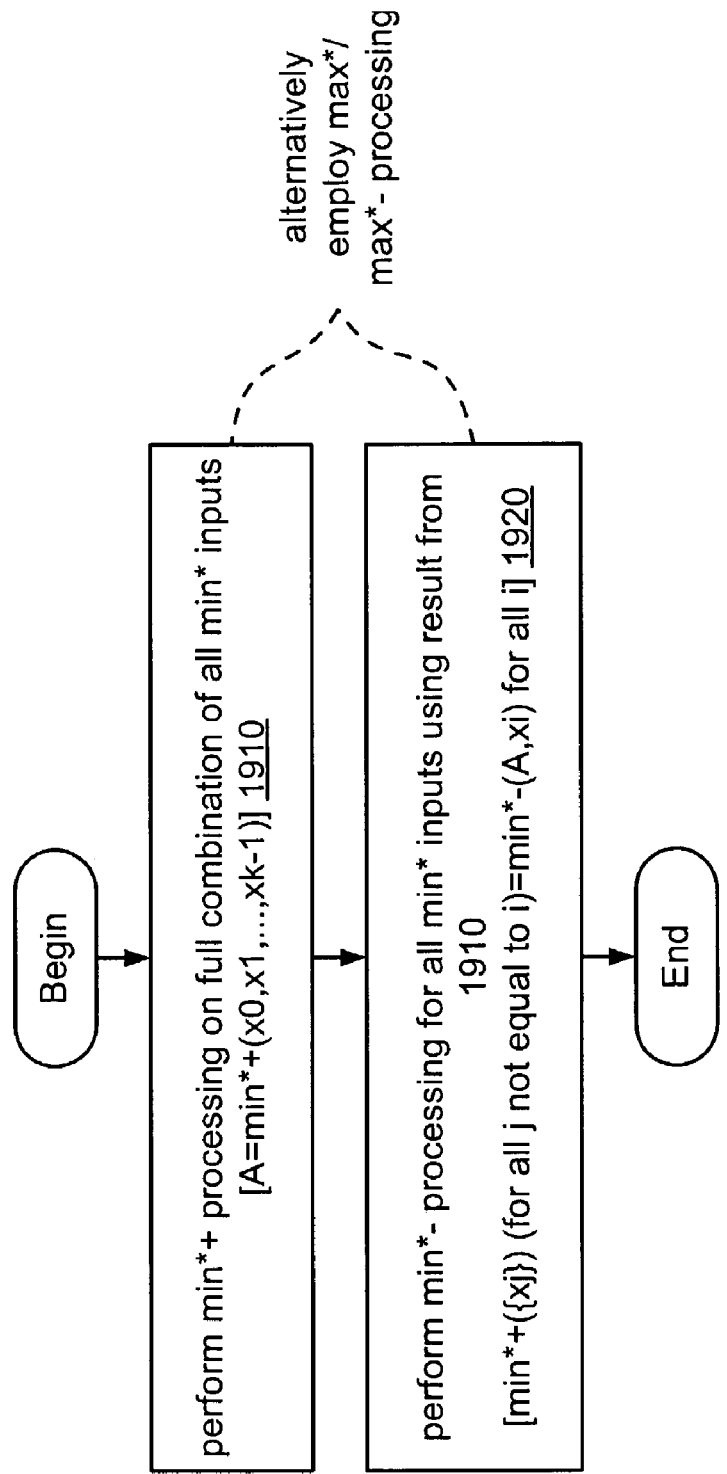
FIG. 19 is an operational flow diagram illustrating an embodiment of a min*− and min*+ processing method that is performed according to the invention.

FIG. 19 is an operational flow diagram illustrating an embodiment of a min*− and min*+ processing method that is performed according to the invention. It is also noted that max*− and max*+ operations may alternatively be employed to perform similar processing according to the invention.

The min*− and min*+ processing method may efficiently be broken down into two separate two separate processing steps, one that performs min*+ processing and one that performs min*− processing. Specifically, as shown in a block 1910, min*+ processing is performed on the full combination of all min* inputs to generate an intermediate variable A=min*+(x0,x1, . . . ,xk−1).

Then, using this intermediate variable A, min*− processing is performing using all of the min* inputs and the intermediate variable A, to generate all of the possible min*(k−1 element) combinations of the min* inputs as shown in a block 1920.

In view of the above detailed description of the invention and associated drawings, other modifications and variations will now become apparent. It should also be apparent that such other modifications and variations may be effected without departing from the spirit and scope of the invention.

What is claimed is:

1. A decoder that is operable to perform min* processing by employing min*− and min*+ processing, comprising:
   a min*+ functional block that performs min*+ processing on a plurality of min* inputs thereby generating an intermediate variable, wherein the plurality of min* inputs is a first plurality of possible values that corresponds to at least one bit encoded within a coded signal that is received from a communication channel; and
   a min*− functional block that performs min*− processing on each min* input of the plurality of min* inputs and the intermediate variable thereby generating a plurality of min* outputs, wherein the plurality of min* outputs is a second plurality of possible values that corresponds to the at least one bit encoded within the coded signal and at least one min* output of the plurality of min* outputs is employed when making a best estimate of the at least one bit encoded within the coded signal.

2. The decoder of claim 1, wherein the min*+ processing operates on two elements, the two elements comprising two min* inputs of the plurality of min* inputs.

3. The decoder of claim 1, wherein the min*− processing operates on two elements, the two elements comprising one min* input of the plurality of min* inputs and the intermediate variable.

4. The decoder of claim 1, wherein the min*+ functional block performs a number of min*+ processes, the number of min*+ processes being less than a number of min* inputs of the plurality of min* inputs.

5. The decoder of claim 1, wherein the min*− functional block performs a number of min*− processes, the number of min*− processes being equal to a number of min* inputs of the plurality of min* inputs.

6. The decoder of claim 1, wherein the min*+ processing comprises an inverse function of the min*− processing on the plurality of min* inputs.

7. The decoder of claim 1, wherein the decoder is operable to perform straightforward min* processing on the plurality of min* inputs.

8. The decoder of claim 1, wherein the decoder is operable to perform intermediate result sharing min* processing.

9. The decoder of claim 1, wherein the decoder is contained within at least one of a satellite receiver, a high definition television (HDTV) set top box receiver, a base station receiver, a mobile receiver, a receiver, a mobile unit, a transceiver, and an advanced modulation satellite receiver.

10. The decoder of claim 1, wherein the decoder is implemented within a communication receiver; and
the communication receiver is contained within at least one of a satellite communication system, a high definition television (HDTV) communication system, a cellular communication system, a microwave communication system, a point-to-point communication system, a uni-directional communication system, a bi-directional communication system, a one to many communication system, and a fiber-optic communication system.

11. The decoder of claim 1, wherein:
the coded signal is a turbo coded signal, a parallel concatenated trellis coded modulated (PC-TCM) coded signal, a turbo trellis coded modulated (TTCM) coded signal, or a LDPC (Low Density Parity Check) coded signal;
if the coded signal is the turbo coded signal, the PC-TCM coded signal, or the TTCM coded signal, the first plurality of possible values or the second plurality of possible values is a plurality of forward metrics (alphas), a plurality of backward metrics (betas), or a plurality of extrinsic values corresponding to the at least one bit encoded within the coded signal; and
if the coded signal is the LDPC coded signal, the first plurality of possible values or the second plurality of possible values is a plurality of check edge messages employed during LDPC decoding of the coded signal.

12. A decoder that is operable to perform min* processing by employing min*− and min*+ processing, comprising:
a min*+ functional block that sequentially performs min*+ processing on two min* input elements, the two min* input elements selected from a plurality of min* inputs, thereby generating an intermediate variable, wherein the plurality of min* inputs is a first plurality of possible values that corresponds to at least one bit encoded within a coded signal that is received from a communication channel; and
a min*− functional block that sequentially performs min*− processing on two elements, the two elements comprising one of the min* inputs of the plurality of min* inputs and the intermediate variable, thereby generating a plurality of min* outputs; and wherein:
the plurality of min* outputs is a second plurality of possible values that corresponds to the at least one bit encoded within the coded signal and at least one min* output of the plurality of min* outputs is employed when making a best estimate of the at least one bit encoded within the coded signal;
the min*+ functional block performs a number of min*+ processes, the number of min*+ processes being less than a number of min* inputs of the plurality of min* inputs;
the min*− functional block performs a number of min*− processes, the number of min*− processes being equal to the number of min* inputs of the plurality of min* inputs; and
the min*+ processing comprises an inverse function of the min*− processing.

13. The decoder of claim 12, wherein the decoder is operable to perform straightforward min* processing on the plurality of min* inputs.

14. The decoder of claim 12, wherein the decoder is operable to perform intermediate result sharing min* processing on the plurality of min* inputs.

15. The decoder of claim 12, wherein the decoder is contained within at least one of a satellite receiver, at high definition television (HDTV) set top box receiver, a base station receiver, a mobile receiver, a receiver, a mobile unit, a transceiver, and an advanced modulation satellite receiver.

16. The decoder of claim 12, wherein the decoder is implemented within a communication receiver; and
the communication receiver is contained within at least one of a satellite communication system, a high definition television (HDTV) communication system, a cellular communication system, a microwave communication system, a point-to-point communication system, a uni-directional communication system, a bi-directional communication system, a one to many communication system, and a fiber-optic communication system.

17. The decoder of claim 12, wherein:
the coded signal is a turbo coded signal, a parallel concatenated trellis coded modulated (PC-TCM) coded signal, a turbo trellis coded modulated (TTCM) coded signal, or a LDPC (Low Density Parity Check) coded signal;
if the coded signal is the turbo coded signal, the PC-TCM coded signal, or the TTCM coded signal, the first plurality of possible values or the second plurality of possible values is a plurality of forward metrics (alphas), a plurality of backward metrics (betas), or a plurality of extrinsic values corresponding to the at least one bit encoded within the coded signal; and
if the coded signal is the LDPC coded signal, the first plurality of possible values or the second plurality of possible values is a plurality of check edge messages employed during LDPC decoding of the coded signal.

18. A decoder that is operable to perform max* processing by employing max*− and max*+ processing, comprising:
a max*+ functional block that performs max*+ processing on a plurality of max* inputs thereby generating an intermediate variable, wherein the plurality of max* inputs is a first plurality of possible values that corresponds to at least one bit encoded within a coded signal that is received from a communication channel; and
a max*− functional block that performs max*− processing on each max* input of the plurality of max* inputs and the intermediate variable thereby generating a plurality of max* outputs, wherein the plurality of max* outputs is a second plurality of possible values that corresponds to the at least one bit encoded within the coded signal and at least one max* output of the plurality of max* outputs is employed when making a best estimate of the at least one bit encoded within the coded signal.

19. The decoder of claim 18, wherein the max*+ processing operates on two elements, the two elements comprising two max* inputs of the plurality of max* inputs.

20. The decoder of claim 18, wherein the max*− processing operates on two elements, the two elements comprising one max* input of the plurality of max* inputs and the intermediate variable.

21. The decoder of claim 18, wherein the max*+ functional block performs a number of max*+ processes, the number of max*+ processes being less than a number of max* inputs of the plurality of max* inputs.

22. The decoder of claim 18, wherein the max*− functional block performs a number of max*− processes, the number of max*− processes being equal to a number of max* inputs of the plurality of max* inputs.

23. The decoder of claim 18, wherein the max*+ processing comprises an inverse function of the max*− processing.

24. The decoder of claim 18, wherein the decoder is operable to perform straightforward max* processing on the plurality of max* inputs.

25. The decoder of claim 18, wherein the decoder is operable to perform intermediate result sharing max* processing on the plurality of max* inputs.

26. The decoder of claim 18, wherein the decoder is contained within at least one of a satellite receiver, a high definition television (HDTV) set top box receiver, a base station receiver, a mobile receiver, a receiver, a mobile unit, a transceiver, and an advanced modulation satellite receiver.

27. The decoder of claim 18, wherein the decoder is implemented within a communication receiver; and the communication receiver is contained within at least one of a satellite communication system, a high definition television (HDTV) communication system, a cellular communication system, a microwave communication system, a point-to-point communication system, a uni-directional communication system, a bi-directional communication system, a one to many communication system, and a fiber-optic communication system.

28. The decoder of claim 18, wherein:

the coded signal is a turbo coded signal, a parallel concatenated trellis coded modulated (PC-TCM) coded signal, a turbo trellis coded modulated (TTCM) coded signal, or a LDPC (Low Density Parity Check) coded signal;

if the coded signal is the turbo coded signal, the PC-TCM coded signal, or the TTCM coded signal, the first plurality of possible values or the second plurality of possible values is a plurality of forward metrics (alphas), a plurality of backward metrics (betas), or a plurality of extrinsic values corresponding to the at least one bit encoded within the coded signal; and if the coded signal is the LDPC coded signal, the first plurality of possible values or the second plurality of possible values is a plurality of check edge messages employed during LDPC decoding of the coded signal.

29. A decoder that is operable to perform max* processing by employing max*− and max*+ processing, comprising:

a max*+ functional block that sequentially performs max*+ processing on two max* input elements, the two max* input elements selected from a plurality of max* inputs, thereby generating an intermediate variable, wherein the plurality of max* inputs is a first plurality of possible values that corresponds to at least one bit encoded within a coded signal that is received from a communication channel; and a max*− functional block that sequentially performs max*− processing on two elements, the two elements comprising one of the max* inputs of the plurality of max* inputs and the intermediate variable, thereby generating a plurality of max* outputs; and wherein:

the plurality of max* outputs is a second plurality of possible values that corresponds to the at least one bit encoded within the coded signal and at least one max* output of the plurality of max* outputs is employed when making a best estimate of the at least one bit encoded within the coded signal;

the max*+ functional block performs a number of max*+ processes, the number of max*+ processes being less than a number of max* inputs of the plurality of max* inputs;

the max*− functional block performs a number of max*− processes, the number of max*− processes being equal to the number of max* inputs of the plurality of max* inputs; and the max*+ processing comprises an inverse function of the max*− processing.

30. The decoder of claim 29, wherein the decoder is operable to perform straightforward max* processing.

31. The decoder of claim 29, wherein the decoder is operable to perform intermediate result sharing max* processing.

32. The decoder of claim 29, wherein the decoder is contained within at least one of a satellite receiver, a high definition television (HDTV) set top box receiver, a base station receiver, a mobile receiver, a receiver, a mobile unit, a transceiver, and an advanced modulation satellite receiver.

33. The decoder of claim 29, wherein the decoder is implemented within a communication receiver; and the communication receiver is contained within at least one of a satellite communication system, a high definition television (HDTV) communication system, a cellular communication system, a microwave communication system, a point-to-point communication system, a uni-directional communication system, a bi-directional communication system, a one to many communication system, and a fiber-optic communication system.

34. The decoder of claim 29, wherein:

the coded signal is a turbo coded signal, a parallel concatenated trellis coded modulated (PC-TCM) coded signal, a turbo trellis coded modulated (TTCM) coded signal, or a LDPC (Low Density Parity Check) coded signal;

if the coded signal is the turbo coded signal, the PC-TCM coded signal, or the TTCM coded signal, the first plurality of possible values or the second plurality of possible values is a plurality of forward metrics (alphas), a plurality of backward metrics (betas), or a plurality of extrinsic values corresponding to the at least one bit encoded within the coded signal; and if the coded signal is the LDPC coded signal, the first plurality of possible values or the second plurality of possible values is a plurality of check edge messages employed during LDPC decoding of the coded signal.

35. A min* processing method that employs min*− and min*+ processing, the method comprising:

performing min*+ processing on a plurality of min* inputs thereby generating an intermediate variable, wherein the plurality of min* inputs is a first plurality of possible values that corresponds to at least one bit encoded within a coded signal that is received from a communication channel;

performing min*− processing on each min* input of the plurality of min* inputs and the intermediate variable thereby generating a plurality of min* outputs, wherein the plurality of min* outputs is a second plurality of possible values that corresponds to the at least one bit encoded within the coded signal; and employing at least one min* output of the plurality of min* outputs when decoding the coded signal, that is received by a communication device, to make a best estimate of the at least one bit encoded within the signal.

36. The method of claim 35, wherein the min*+ processing operates on two elements, the two elements comprising two min* inputs of the plurality of min* inputs.

37. The method of claim 35, wherein the min*- processing operates on two elements, the two elements comprising one min* input of the plurality of min* inputs and the intermediate variable.

38. The method of claim 35, wherein the min*+ processing performs a number of min*+ processes, the number of min*+ processes being less than a number of min* inputs of the plurality of min* inputs.

39. The method of claim 35, wherein the min*- processing performs a number of min*- processes, the number of min*- processes being equal to a number of min* inputs of the plurality of min* inputs.

40. The method of claim 35, wherein the min*+ processing comprises an inverse function of the min*- processing.

41. The method of claim 35, further comprising performing straightforward min* processing on the plurality of min* inputs.

42. The method of claim 35, further comprising performing intermediate result sharing min* processing on the plurality of min* inputs.

43. The method of claim 35, wherein the method is performed within a decoder; and
the decoder is contained within at least one of a satellite receiver, a high definition television (HDTV) set top box receiver, a base station receiver, a mobile receiver, a receiver, a mobile unit, a transceiver, and an advanced modulation satellite receiver.

44. The method of claim 35, wherein the method is performed within a decoder;
the decoder is implemented within the communication device; and
the communication device is contained within at least one of a satellite communication system, a high definition television (HDTV) communication system, a cellular communication system, a microwave communication system, a point-to-point communication system, a uni-directional communication system, a bi-directional communication system, a one to many communication system, and a fiber-optic communication system.

45. The method of claim 35, wherein:
the coded signal is a turbo coded signal, a parallel concatenated trellis coded modulated (PC-TCM) coded signal, a turbo trellis coded modulated (TTCM) coded signal, or a LDPC (Low Density Parity Check) coded signal;
if the coded signal is the turbo coded signal, the PC-TCM coded signal, or the TTCM coded signal, the first plurality of possible values or the second plurality of possible values is a plurality of forward metrics (alphas), a plurality of backward metrics (betas), or a plurality of extrinsic values corresponding to the at least one bit encoded within the coded signal; and
if the coded signal is the LDPC coded signal, the first plurality of possible values or the second plurality of possible values is a plurality of check edge messages employed during LDPC decoding of the coded signal.

46. A max* processing method that employs max*- and max*+ processing, the method comprising:
performing max*+ processing on a plurality of max* inputs thereby generating an intermediate variable, wherein the plurality of max* inputs is a first plurality of possible values that corresponds to at least one bit encoded within a coded signal that is received from a communication channel;
performing max*- processing on each max* input of the plurality of max* inputs and the intermediate variable thereby generating a plurality of max* outputs, wherein the plurality of max* outputs is a second plurality of possible values that corresponds to the at least one bit encoded within the coded signal; and
employing at least one max* output of the plurality of max* outputs when decoding the coded signal, that is received by a communication device, to make a best estimate of the at least one bit encoded within the signal.

47. The method of claim 46, wherein the max*+ processing operates on two elements, the two elements comprising two max* inputs of the plurality of max* inputs.

48. The method of claim 46, wherein the max*- processing operates on two elements, the two elements comprising one max* input of the plurality of max* inputs and the intermediate variable.

49. The method of claim 46, wherein the max*+ processing performs a number of max*+ processes, the number of max*+ processes being less than a number of max* inputs of the plurality of max* inputs.

50. The method of claim 46, wherein the max*- processing performs a number of max*- processes, the number of max*- processes being equal to a number of max* inputs of the plurality of max* inputs.

51. The method of claim 46, wherein the max*+ processing comprises an inverse function of the max*- processing.

52. The method of claim 46, further comprising performing straightforward max* processing on the plurality of max* inputs.

53. The method of claim 46, further comprising performing intermediate result sharing max* processing on the plurality of max* inputs.

54. The method of claim 46, wherein the method is performed within a decoder; and
the decoder is contained within at least one of a satellite receiver, a high definition television (HDTV) set top box receiver, a base station receiver, a mobile receiver, a receiver, a mobile unit, a transceiver, and an advanced modulation satellite receiver.

55. The method of claim 46, wherein the method is performed within a decoder;
the decoder is implemented within the communication device; and
the communication device is contained within at least one of a satellite communication system, a high definition television (HDTV) communication system, a cellular communication system, a microwave communication system, a point-to-point communication system, a uni-directional communication system, a bi-directional communication system, a one to many communication system, and a fiber-optic communication system.

56. The method of claim 46, wherein:
the coded signal is a turbo coded signal, a parallel concatenated trellis coded modulated (PC-TCM) coded signal, a turbo trellis coded modulated (TTCM) coded signal, or a LDPC (Low Density Parity Check) coded signal;
if the coded signal is the turbo coded signal, the PC-TCM coded signal, or the TTCM coded signal, the first plurality of possible values or the second plurality of possible values is a plurality of forward metrics (alphas), a plurality of backward metrics (betas), or a plurality of extrinsic values corresponding to the at least one bit encoded within the coded signal; and
if the coded signal is the LDPC coded signal, the first plurality of possible values or the second plurality of possible values is a plurality of check edge messages employed during LDPC decoding of the coded signal.

* * * * *

UNITED STATES PATENT AND TRADEMARK OFFICE
CERTIFICATE OF CORRECTION

| | | |
|---|---|---|
| PATENT NO. | : 7,360,146 B1 | Page 1 of 1 |
| APPLICATION NO. | : 10/347732 | |
| DATED | : April 15, 2008 | |
| INVENTOR(S) | : Ba-Zhong Shen et al. | |

It is certified that error appears in the above-identified patent and that said Letters Patent is hereby corrected as shown below:

Title Page, Item (60): replace "now abandoned," with --now expired,--

Title Page, Item (60): replace the 2nd "now abandoned." with --now expired--

Column 1, line 14: replace "now abandoned." with --now expired.--

Column 1, line 18: replace "now abandoned." with --now expired.--

Signed and Sealed this

Thirtieth Day of March, 2010

David J. Kappos
*Director of the United States Patent and Trademark Office*